(12) United States Patent
Muranaka et al.

(10) Patent No.: US 12,276,037 B2
(45) Date of Patent: Apr. 15, 2025

(54) ANODIZED TITANIUM MATERIAL AND METHOD FOR PRODUCING THE SAME

(71) Applicants: Yamaguchi Prefectural Industrial Technology Institute, Yamaguchi (JP); Sanwa Industry Co., Ltd., Yamaguchi (JP); Tokyo Electron Limited, Tokyo (JP)

(72) Inventors: Takehiko Muranaka, Yamaguchi (JP); Kouji Niimi, Yamaguchi (JP); Yuuta Ueno, Yamaguchi (JP); Hikaru Kikuchi, Miyagi (JP); Hideto Saito, Miyagi (JP); Nobuyuki Nagayama, Miyagi (JP)

(73) Assignees: YAMAGUCHI PREFECTURAL INDUSTRIAL TECHNOLOGY INSTITUTE, Yamaguchi (JP); SANWA INDUSTRY CO., LTD., Yamaguchi (JP); TOKYO ELECTRON LIMITED, Tokyo (JP)

(*) Notice: Subject to any disclaimer, the term of this patent is extended or adjusted under 35 U.S.C. 154(b) by 753 days.

(21) Appl. No.: 17/169,593

(22) Filed: Feb. 8, 2021

(65) Prior Publication Data

US 2021/0207283 A1 Jul. 8, 2021

Related U.S. Application Data

(63) Continuation of application No. PCT/JP2019/031334, filed on Aug. 8, 2019.

(30) Foreign Application Priority Data

Aug. 10, 2018 (JP) .................. 2018-151769

(51) Int. Cl.
*H01J 37/32* (2006.01)
*B32B 15/01* (2006.01)
(Continued)

(52) U.S. Cl.
CPC ............. *C25D 11/26* (2013.01); *B32B 15/01* (2013.01); *H01J 37/3244* (2013.01);
(Continued)

(58) Field of Classification Search
CPC ......... C25D 11/26; B32B 15/01; B32B 15/04; H01J 37/3244; H01J 37/32715; H01J 2237/002; H01L 21/67069; H01L 21/6833
(Continued)

(56) References Cited

U.S. PATENT DOCUMENTS

2015/0132602 A1* 5/2015 Sun ..................... C23C 28/322
205/333
2016/0153112 A1 6/2016 Duran et al.

FOREIGN PATENT DOCUMENTS

CN 105723503 A 6/2016
JP H06-236548 A 8/1994
(Continued)

OTHER PUBLICATIONS

International Search Report and Written Opinion mailed on Oct. 1, 2019, received for PCT Application PCT/JP2019/031334, Filed on Aug. 8, 2019, 9 pages including English Translation.
(Continued)

*Primary Examiner* — Katherine A Christy
(74) *Attorney, Agent, or Firm* — XSENSUS LLP

(57) ABSTRACT

An anodized titanium material includes a titanium base material and an anodized titanium layer. The anodized titanium layer is provided on a surface of the titanium base material. The anodized titanium layer includes a porous first anodized titanium layer. The anodized titanium layer has a withstand voltage at 25° C. of 500 V or more, a Vickers hardness of 200 or more, a film thickness of 20 μm or more and less than 80 μm, an arithmetic average roughness Ra of a surface of less than 1.6 μm, and a maximum height
(Continued)

roughness Rz of the surface is less than 6.3 μm. In both of a section perpendicular to a thickness direction of the first anodized titanium oxide layer and the surface, no pore sections having a shape capable of including a circle having a diameter of 0.5 μm or more are observed.

7 Claims, 13 Drawing Sheets

(51) Int. Cl.
      *C25D 11/26*       (2006.01)
      *H01L 21/67*       (2006.01)
      *H01L 21/683*       (2006.01)

(52) U.S. Cl.
    CPC .. *H01J 37/32715* (2013.01); *H01L 21/67069* (2013.01); *H01L 21/67103* (2013.01); *H01L 21/6833* (2013.01); *H01J 2237/002* (2013.01); *H01J 2237/2007* (2013.01); *H01J 2237/334* (2013.01)

(58) Field of Classification Search
    USPC .......................................................... 428/472
    See application file for complete search history.

(56) References Cited

FOREIGN PATENT DOCUMENTS

| JP | 2005-136350 A | 5/2005 |
|----|---------------|--------|
| JP | 2008-66707 A | 3/2008 |
| JP | 2008-184652 A | 8/2008 |
| JP | 2012-57253 A | 3/2012 |
| JP | 2014-53481 A | 3/2014 |
| JP | 2016-537506 A | 12/2016 |
| TW | 201522717 A | 6/2015 |

OTHER PUBLICATIONS

Albu et al., "250 μm Long TiO2 Nanotubes With Hexagonal Self-Ordering", Physica Status Solidi (RRL), No. 2, 2007, pp. R65-R67.

Ghicov et al., "Self-Ordering Electrochemistry: A Review on Growth and Functionality of TiO2 Nanotubes and Other Self-Aligned MOx Structures", Chemical Communications, The Royal Society of Chemistry, 2009, pp. 2791-2808.

* cited by examiner

100

200

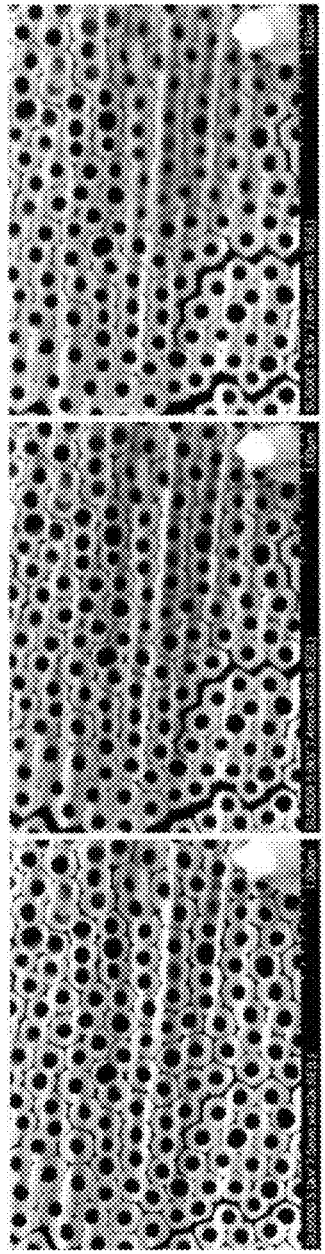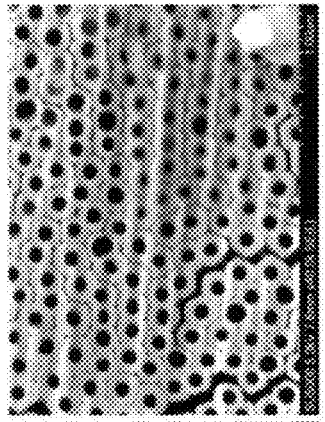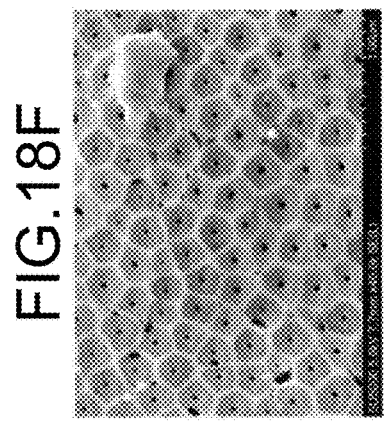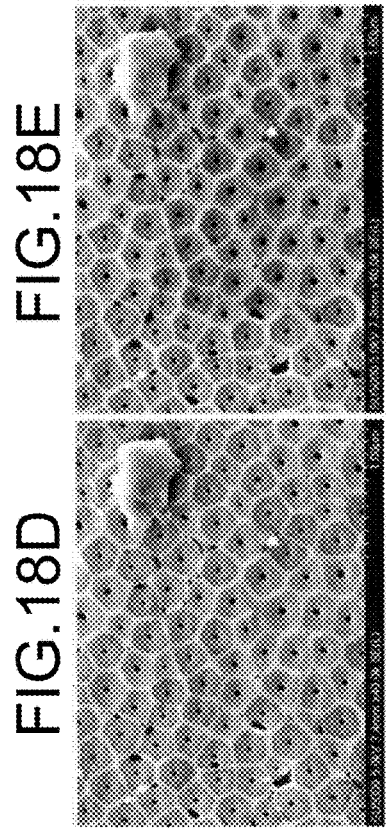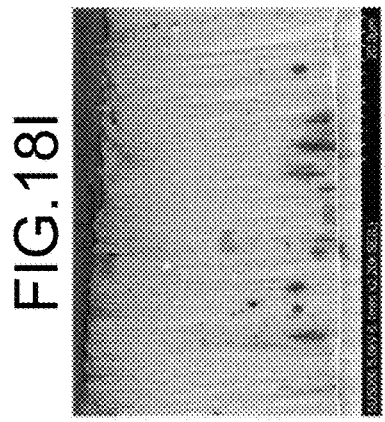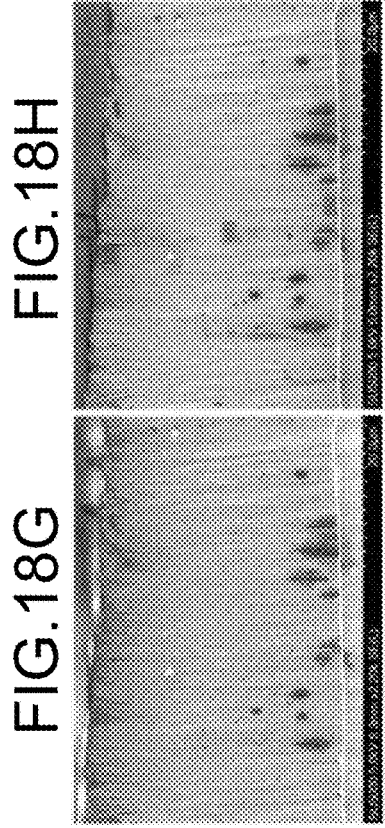

ANODIZED TITANIUM MATERIAL AND METHOD FOR PRODUCING THE SAME

CROSS-REFERENCE TO RELATED APPLICATIONS

This application is a continuation of PCT International Application No. PCT/JP2019/031334 filed on Aug. 8, 2019 which claims the benefit of priority from Japanese Patent Application No. 2018-151769 filed on Aug. 10, 2018, the entire contents of each are incorporated herein by reference.

FIELD

The present disclosure relates to an anodized titanium material and a method for producing the same and, more particularly, relates to an anodized titanium material having an improved withstand voltage property that can be preferably used for, for example, the electrostatic chuck of a plasma etching apparatus and a method for producing the same.

BACKGROUND

As an etching method for producing a semiconductor element, a plasma etching method has been known. In the plasma etching method, an etching gas is converted into plasma in a vacuum chamber and a semiconductor substrate is etched by ions and/or radicals generated by the plasma. The plasma etching apparatus includes a vacuum chamber, a support pedestal (susceptor) on which the semiconductor substrate is placed, and an upper electrode placed in the vacuum chamber so as to face the susceptor. The susceptor includes a lower electrode. The upper electrode includes holes (gas introduction holes) for introducing the etching gas into the vacuum chamber. At the time of performing the plasma etching of the semiconductor substrate, the etching gas is introduced into a vacuum chamber from the gas introduction holes in a state where the semiconductor substrate is held on a susceptor and a high-frequency voltage is applied between the lower electrode and the upper electrode to generate plasma.

The susceptor includes an electrostatic chuck in order to keep the semiconductor substrate on the susceptor during the plasma etching. In general, the electrostatic chuck includes an electrode and a dielectric layer (insulating layer) placed above the electrode. The semiconductor substrate is stuck and held on the electrostatic chuck by disposing the semiconductor substrate on the dielectric layer and applying predetermined direct-current voltage to the electrode. For example, in a Coulomb force type electrostatic chuck, the semiconductor substrate is charged by causing electrostatic induction or dielectric polarization with respect to the electric charge applied to the electrode and thus an attracting force (Coulomb force) is generated between the electric charge of the electrode and the electric charge of the semiconductor substrate. For example, in a Johnson-Rahbek force type electrostatic chuck, the electric charge applied to the electrode moves to the outermost surface of the dielectric layer through the dielectric layer and the semiconductor substrate causes electrostatic induction or dielectric polarization with respect to the charge. As a result, an attracting force (Johnson-Rahbek force) is generated between the charge of the electrostatic chuck and the charge of the semiconductor substrate.

Patent Literature 1: Japanese Patent Application Laid-open No. 2005-136350

Patent Literature 2: Japanese Patent Application Laid-open No. 2008-066707

Patent Literature 3: Japanese Patent Application Laid-open No. 2014-053481

Non Patent Literature 1: Albu, S. P.; Ghicov, A.; Macak, J. M.; and Schmuki, P., Phys. Stat. Sol. (RRL) 1, No. 2, R65-R67 (2007).

Non Patent Literature 2: Ghicov, A.; and Schmuki, P., Chem. Commun., 2009, 2791-2808.

SUMMARY

According to an aspect of a present disclosure, an anodized titanium material includes a titanium base material and an anodized titanium layer. The anodized titanium layer is provided on a surface of the titanium base material. The anodized titanium layer includes a porous first anodized titanium layer. The anodized titanium layer has a withstand voltage at 25° C. of 500 V or more, a Vickers hardness of 200 or more, a film thickness of 20 µm or more and less than 80 µm, an arithmetic average roughness Ra of a surface of less than 1.6 µm, and a maximum height roughness Rz of the surface is less than 6.3 µm. In both of a section perpendicular to a thickness direction of the first anodized titanium oxide layer and the surface, no pore sections having a shape capable of including a circle having a diameter of 0.5 µm or more are observed.

BRIEF DESCRIPTION OF DRAWINGS

FIG. 9(A) is the sectional SEM image of the surface layer part of the anodized titanium layer. FIG. 9(B) is the sectional SEM image of the center of the anodized titanium layer. FIG. 9(C) is the sectional SEM image in the vicinity of the interface between the anodized titanium layer and a titanium base material.

FIG. 10(A) is an observation result of a relatively shallow location from the surface. FIG. 10(B) is an observation result of a relatively deep location from the surface.

FIG. 13(A) is a graph illustrating the temperature dependence of the withstand voltage of the anodized titanium layer obtained in Example 1. FIG. 13(B) is a graph illustrating the temperature dependence of the withstand voltage of the anodized titanium layer obtained in Example 2.

FIG. 15(A) is the sectional SEM image illustrating the entire anodized titanium layer. FIG. 15(B) is the sectional SEM image in the vicinity of the interface between the anodized titanium layer and the titanium base material.

FIGS. 18(A) to 18(I) include the sectional SEM images of the anodized titanium layer obtained in Example 3 and SEM images of the surface of the surface layer side and the surface of the base material side of the separated anodized titanium layer, which illustrate morphology change in the porous structure associated with temperature change. The left columns FIGS. 18(A), 18(D), and 18(G) in FIGS. 18(A) to 18(I) include the SEM images at room temperature (26° C.) in an initial state, the middle columns FIGS. 18(B), 18(E), and 18(H) of FIGS. 18(A) to 18(1) include the SEM images at 150° C., and the right column FIGS. 18(C), 18(F), and 18(I) in FIGS. 18(A) to 18(1) include the SEM images when the sample temperature is returned to room temperature (26° C.) The upper row FIGS. 18(A), 18(B), and 18(C) in FIGS. 18(A) to 18(I) include the SEM images of the surface of the surface layer side of the anodized titanium layer, the middle row FIGS. 18(D), 18(E), and 18(F) in FIGS. 18(A) to 18(I) include the SEM images of the surface of the base material side of the anodized titanium layer, and the lower row FIGS. 18(G), 18(H), and 18(I) include the sectional SEM images of the anodized titanium layer.

DESCRIPTION OF EMBODIMENTS

Figure 1:
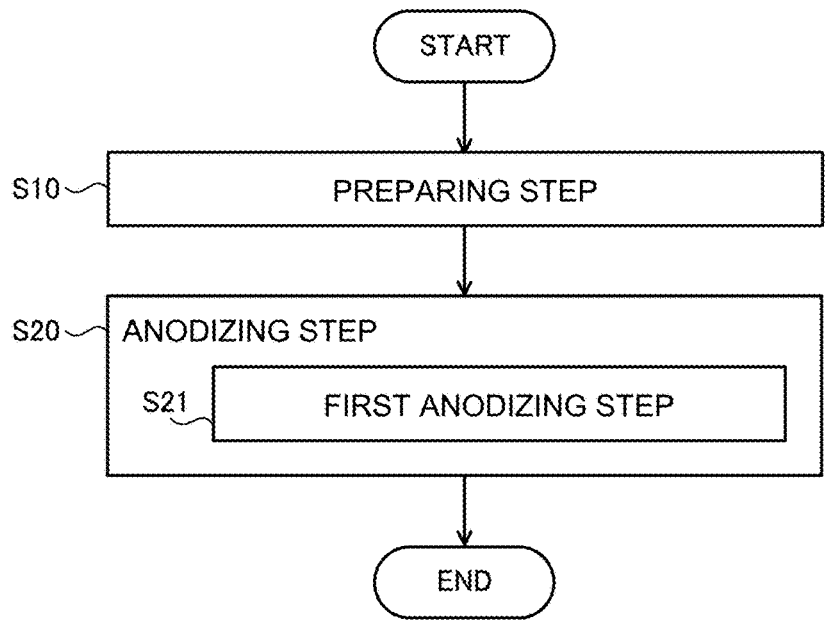
FIG. 1 is a flowchart illustrating a method S100 of for producing an anodized titanium material according to one exemplary embodiment of the present disclosure.

The above-described effects and advantages of the present disclosure will be clarified from exemplary embodiments for performing the disclosure described below. Hereinafter, the exemplary embodiments of the present disclosure will be described with reference to the drawings. The present disclosure, however, is not limited to these exemplary embodiments. The drawings do not necessarily reflect exact dimensions. In the drawings, some reference signs may be omitted. In this specification, the notation "A to B" for numerical values A and B means "A or more and B or less" unless otherwise specified. In the case where a unit is added only to the numerical value B in such a notation, the unit is also applied to the numerical value A. Furthermore, the term "or" means a logical sum unless otherwise specified.

The electrostatic chuck used in a plasma etching apparatus is required to have a high withstand voltage property, that is, not to cause dielectric breakdown of the dielectric layer. Use of alumina ($Al_2O_3$) as a material of the insulating layer (dielectric layer) of the electrostatic chuck has been known. In the case where alumina is used for the insulating layer, aluminum is generally used as an electrode and a base material thereunder. There is, however, a large difference in the thermal expansion coefficients between alumina and aluminum. Therefore, an increase in the electrode temperature results in applying a large stress to the insulating layer due to the difference in the thermal expansion coefficients between alumina and aluminum and thus cracks are easily generated in the insulating layer.

As an alternative material system having a small difference in the thermal expansion coefficients between the oxide layer and the base material, use of a titanium oxide/titanium system can be considered. In order to improve the withstand voltage property of the insulating layer, the insulating layer needs to have sufficient uniformity and a layer thickness. The uniformity of the insulating layer is also important for obtaining the surface smoothness required for the electrostatic chuck. Anodization of titanium has been known as a technique for forming a highly uniform titanium oxide layer. Formation of an anodized titanium layer having a sufficient withstand voltage property as the insulating layer of the electrostatic chuck for plasma etching, however, is extremely difficult and such an example has not been reported until now. Non-Patent Document 1 has described that a layer having a thickness of 250 μm (that is, an anodized titanium layer) made of self-assembled hexagonal $TiO_2$ nanotubes has been grown by anodizing titanium. However, even an anodized titanium layer having a thickness of more than 20 μm has not been able to be obtained under the conditions described in Non-Patent Literature 1 when the inventors of the present disclosure has conducted a replication test.

<Method for Producing Anodized Titanium Material>

FIG. 1 is a flowchart illustrating a method S100 for producing the anodized titanium material according to one exemplary embodiment of the present disclosure (hereinafter, may be referred to as the "production method S100"). The production method S100 includes a preparing step S10 and an anodizing step S20. The anodizing step S20 includes a first anodizing step S21.

The preparing step S10 is a step of preparing a processed material having titanium on the surface. As the processed material, for example, a member made of titanium may be used as it is, or for example, the processed material may be obtained by forming a titanium layer on the surface of a metal base material other than titanium (for example, aluminum, stainless steel, or a combination thereof). As a method for forming the titanium layer on the surface of the metal base material other than titanium, a known method such as sputtering, an ionization vapor deposition method, or a vacuum evaporation method can be used without particular limitation. In the case where the titanium layer is formed on the surface of the metal base material other than titanium, the thickness of the titanium layer is usually 5 μm or more, preferably 10 μm or more, and more preferably 20 μm or more. In the case where the titanium layer is formed on the surface of the metal base material other than titanium, the titanium layer having a thickness of equal to or more than the lower limit facilitates the anodized titanium layer having a sufficient film thickness to grow. Consequently, an increase in the withstand voltage property of the anodized titanium layer is easily achieved. The upper limit of the thickness of the titanium layer is not particularly limited and may be determined to be, for example, 100 µm or less.

The arithmetic average roughness Ra of the titanium surface of the processed material prepared in the preparing step S10 is preferably less than 1 µm and more preferably less than 0.5 µm. The lower limit thereof is not particularly limited and may be, for example, 0.1 µm or more.

The maximum height roughness Rz of the titanium surface of the processed material prepared in the preparing step S10 is preferably less than 10 µm and more preferably less than 5 µm. The lower limit is not particularly limited and may be, for example, 1 µm or more.

The arithmetic average roughness Ra and the maximum height roughness Rz of the titanium surface of the processed material prepared in the preparing step S10 are less than the above upper limits, whereby the anodized titanium material having a high smoothness of the anodized titanium layer described below is easily produced. In the present specification, the arithmetic average roughness Ra and the maximum height roughness Rz of the surface mean the arithmetic average roughness and the maximum height roughness specified in JIS B0601, respectively.

The preparing step S10 may include a step of polishing the titanium surface of the processed material. As a method for polishing the titanium surface of the processed material, known methods such as polishing paper, buff polishing, chemical polishing, and chemomechanical polishing (CMP) can be employed without particular limitation.

The preparing step S10 may include a step of preprocessing the processed material. Examples of the preprocess may include degreasing, washing with an acid, washing with water, etching, and combinations thereof. The degreasing process can be performed by a known method and can be preferably performed by, for example, alkaline electrolytic degreasing using the processed material as an anode. The alkaline electrolytic degreasing using the processed material as the anode facilities the adhesion of the anodized titanium layer to be enhanced. After the alkaline electrolytic degreasing using the processed material as the anode, the processed material is preferably washed with an acid in order to remove an oxide coated film.

The anodizing step S20 is a step of anodizing the processed material prepared in the preparing step S10. The anodizing step S20 includes a first anodizing step S21. The first anodizing step S21 is a step of anodizing the processed material prepared in the preparing step S10 in a first electrolytic solution. By subjecting to the first anodizing step S21, a porous first anodized titanium layer grows on the surface of the titanium base material of the processed material.

As an electrolytic tank used in the first anodizing step S21, a known electrolytic tank that can be used for anodizing can be used without particular limitation. Examples of such an electrolytic tank include an electrolytic tank including a container for retaining the electrolytic solution, a stirring device for stirring the electrolytic solution in the container, and a cooling device for cooling the electrolytic solution in the container. As a cathode used in the first anodizing step S21, a known cathode that does not dissolve in the first electrolytic solution can be used without particular limitation.

In the first anodizing step S21, the first electrolytic solution includes a non-aqueous solvent that can be uniformly mixed with water and a fluoride ion source. The first electrolytic solution may further include water or does not necessarily include water.

As the non-aqueous solvent, for example, organic solvents that can be uniformly mixed with water such as ethylene glycol, glycerin, ethanol, isopropyl alcohol, and combinations thereof can be preferably used. Of these organic solvents, ethylene glycol, glycerin, or a combination thereof can be particularly preferably used. The content of the non-aqueous solvent in the first electrolytic solution is preferably 88% to 97% by mass, and more preferably 90% to 96% by mass relative to the entire amount of the electrolytic solution.

The fluoride ion source is a substance that provides fluoride ions in the electrolytic solution and acts as an electrolyte in the first electrolytic solution and also acts as a solubilizing agent for dissolving the oxide of titanium in the electrolytic solution. The fluoride ion source is preferably soluble in the non-aqueous solvent in the case where the first electrolytic solution does not include water, whereas is preferably soluble in the mixture of the non-aqueous solvent and water in the case where the first electrolytic solution includes water. Examples of the fluoride ion source include hydrogen fluoride; metal fluorides such as lithium fluoride, sodium fluoride, potassium fluoride, potassium hydrogen fluoride, cesium fluoride, magnesium fluoride, and zinc fluoride; ammonium fluoride, ammonium hydrogen fluoride (acidic ammonium fluoride); and amine salts or organic bases-hydrogen fluoride adducts such as trimethylamine trihydrofluoride, triethylamine trihydrofluoride, tributylamine trihydrofluoride, and hydrogen fluoride pyridine. The fluoride ion source may be used singly or may be used in combination of two or more of the fluoride ion sources. Of these fluoride ion sources, ammonium fluoride ($NH_4F$), ammonium hydrogen fluoride ($NH_4F \cdot HF$), or a combination thereof can be particularly preferably used from the viewpoint of increasing the withstand voltage property of the anodized titanium layer. The content of the fluoride ion source in the first electrolytic solution (total content in the case where two or more types of fluoride ion sources are used in combination) is preferably 2,000 to 5,000 ppm by mass, more preferably 3,000 to 4,000 ppm by mass, and particularly preferably 3,250 to 3,750 ppm by mass in terms of fluorine atoms relative to the entire amount of the electrolytic solution. The first electrolytic solution having a concentration of the fluoride ion source within the above range facilitates formation of a thicker anodized titanium layer and thus the anodized titanium layer having an improved withstand voltage property is easily formed. The content of the entire fluoride ion source may be, for example, 2% to 5% by mass relative to the entire amount of the electrolytic solution.

In the first electrolytic solution, water acts as an oxide ion ($O^{2-}$) source with respect to titanium. In the case where the non-aqueous solvent does not have an oxide ion-donating ability with respect to titanium under electrolysis conditions, the first electrolytic solution preferably includes water, whereas in the case where the non-aqueous solvent has the oxide ion-donating ability for titanium, the first electrolytic solution does not necessarily include water. For example, in the case where the non-aqueous solvent is ethylene glycol, the first electrolytic solution preferably includes water, whereas in the case where the non-aqueous solvent is glycerin, the first electrolytic solution does not necessarily include water. As the water, deionized water can be preferably used. In the case where the first electrolytic solution includes water, the content thereof is preferably 1% to 10% by mass, more preferably 2% to 9% by mass, and particularly preferably 4% to 6% by mass relative to the entire amount of the electrolytic solution from the viewpoint of forming a thicker anodized titanium layer to improve the withstand voltage property.

In one preferable exemplary embodiment, the first electrolytic solution is prepared so as to include 88% to 97% by mass, more preferably 90% to 96% by mass, and particularly preferably 90% to 93% by mass of ethylene glycol; 1% to 10% by mass, more preferably 2% to 9% by mass, and particularly preferably 4% to 6% by mass of water; and 2,000 to 5,000 ppm by mass, more preferably 3,000 to 4,000 ppm by mass, and particularly preferably 3,250 to 3,750 ppm by mass of the fluoride ion source in terms of fluorine atom relative to the entire amount of the electrolytic solution.

In the first anodizing step S21, the temperature of the first electrolytic solution is maintained at 10° C. or less and preferably 5° C. or less. The first electrolytic solution having a temperature equal to or lower than the upper limit allows a thicker anodized titanium layer to be formed and thus allows the withstand voltage property to be improved. From the viewpoint of increasing the adhesion and withstand voltage property of the anodized titanium layer, the temperature of the first electrolytic solution is preferably 0° C. or more and more preferably 3° C. or more. In controlling the temperature of the first electrolytic solution, a known cooling device used for the electrolytic tank can be used without particular limitation.

In the first anodizing step S21, the electrolysis voltage is 200 V or less, preferably 150 V or less, more preferably 140 V or less, and particularly preferably 135 V or less. The electrolysis voltage lower than the upper limit allows a situation where uniformity and surface smoothness of the anodized titanium layer are impaired by causing micro-arc oxidation, which is discontinuous electrochemical oxidation with spark discharge, to generate coarse voids in the anodized titanium layer and at the same time, the withstand voltage property is deteriorated, to be prevented. The lower limit of the electrolysis voltage is usually 10 V or more and preferably 40 V or more.

In the first anodizing step S21, the relative flow rate of the first electrolytic solution with respect to the processed material is maintained at 1 cm/sec or more and 5 cm/sec or less. The relative flow rate means a relative velocity of the electrolytic solution with respect to the processed material immediately before electrolytic solution reaches the processed material. The relative flow rate can be measured in a manner that the flow rate of the electrolytic solution at a position immediately before electrolytic solution reaches the processed material (surface that should be anodized) (for example, 2 cm before the surface) is measured by placing the measurement head or probe of a known velocimeter such as an electromagnetic velocimeter (for example, a three-dimensional electromagnetic velocimeter ACM3-RS (manufactured by JFE Advantech Co., Ltd.), three-dimensional electromagnetic velocimeters VM-1001 and VMT3-200-13P (manufactured by Kenek Corporation), electromagnetic fine velocimeters VM-801L and VMT2-50-08PS (manufactured by Kenek Corporation), and electromagnetic velocimeters VP2500 and VPT2-200-08CA (manufactured by Kenek Corporation)) and a laser Doppler velocimeter (for example, PowerSight (manufactured by TSI Incorporated), FiberFlow, FlowLite, and FlowExplorer (all manufactured by Dantec Dynamics A/S), and 2D-FLV System 8835 and Smart LDVIII (both manufactured by Nippon Kanomax Co., Ltd.) at the position. The relative flow rate of the first electrolytic solution equal to or more than the lower limit allows a situation where substrate temperature excessively rises to be prevented and a reagent to be efficiently supplied to the member surface. Consequently, a thicker anodized titanium layer can be formed to improve the withstand voltage property. The relative flow rate of the first electrolytic solution equal to or less than the upper limit allows the uniformity of the film thickness of the anodized titanium layer to be improved.

In the first anodizing step S21, an electrolysis current density is preferably 1 mA/cm$^2$ or more and more preferably 5 mA/cm$^2$ or more and preferably 100 mA/cm$^2$ or less and more preferably 50 mA/cm$^2$ or less as a value determined by dividing the electrolysis current by the area of the titanium surface of the processed material. The electrolysis current density equal to or higher than the lower limit facilitates the withstand voltage property to be improved due to increasing the generation rate of titanium oxide to form thicker first anodized titanium layer. The electrolysis current density equal to or lower than the upper limit facilitates a thicker first anodized titanium layer to be formed due to increasing the generation rate of the titanium oxide and the withstand voltage property to be improved, whereas the electrolysis current density equal to or less than the upper limit facilitates the micro-arc oxidation to be prevented.

In the anodizing step S20, an electrolysis time cannot be unconditionally determined because the electrolysis time depends on other conditions such as the composition, temperature, and flow rate of the electrolytic solution, and electrolysis voltage. The electrolysis time is preferably determined so that the film thickness of the anodized titanium layer is 20 μm or more and less than 80 μm. Excessively short electrolysis time results in insufficient growth of the film thickness of the anodized titanium layer, whereas excessively long electrolysis time tends to increase the residue on the outermost surface of the anodized titanium layer. Appropriate electrolysis time can be easily determined by preliminary experiments.

After completion of the anodizing step S20, a washing process may be further performed in order to remove the electrolytic solution from the surface of the processed material. In the washing process, known polar solvents such as water, ethanol, acetone, and isopropyl alcohol can be used.

Figure 2:
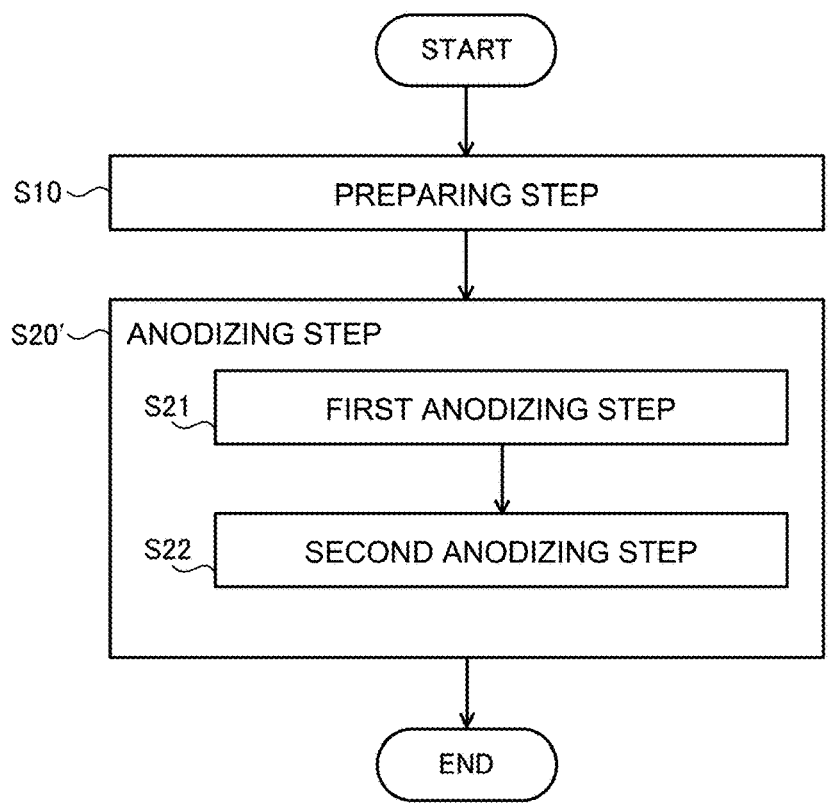
FIG. 2 is a flowchart illustrating a method S200 for producing an anodized titanium material according to another exemplary embodiment of the present disclosure.

FIG. 2 is a flowchart illustrating a method S200 for producing an anodized titanium material (hereinafter, may be referred to as the "production method S200") according to another exemplary embodiment. The production method S200 differs from the production method S100 in that an anodizing step S20' having the first anodizing step S21 and a second anodizing step S22 is included instead of the anodizing step S20. The preparing step S10 and the first anodizing step S21 are as described above in relation to the production method S100.

The second anodizing step S22 is a step of anodizing the processed material, which is subjected to the first anodizing step S21, in the second electrolytic solution including the fluoride ion source having a concentration of 10 ppm by mass or less in terms of fluorine atoms or including no fluoride ion source. By subjecting to the second anodizing step S22, the second anodizing titanium layer is grown between the titanium base material serving as the processed material and the first anodized titanium layer grown in the first anodizing step S21. The fluorine content (unit: atomic %) of the second anodized titanium layer is lower than the fluorine content (unit: atomic %) of the first anodized titanium layer. According to the production method S200 having an aspect of including the second anodizing step S22, the adhesion of the anodized titanium layer can also be improved and, in addition, the withstand voltage property of the anodized titanium layer can be further improved.

As the electrolytic tank used in the second anodizing step S22, an electrolytic tank similar to the electrolytic tank described above in the first anodizing step S21 can be used without particular limitation. As a cathode used in the second anodizing step S22, a known cathode that is not dissolved into the second electrolytic solution can be used without particular limitation.

In the second anodizing step S22, the concentration of the fluoride ion source in the second electrolytic solution is 10 ppm by mass or less, preferably less than 5 ppm by mass, and particularly preferably less than 3 ppm by mass in terms of fluorine atoms relative to the entire amount of the electrolytic solution. The concentration may be 0 ppm by mass.

The second electrolytic solution may or does not necessarily include the non-aqueous solvent as a solvent and may or does not necessarily include water. The second electrolytic solution, however, preferably includes a substance having the oxide ion-donating ability with respect to titanium. In the second electrolytic solution, the solvent may have the oxide ion-donating ability, the solute may have the oxide ion-donating ability, or both of the solvent and the solute may have the oxide ion-donating ability.

As the solvent of the second electrolytic solution, the non-aqueous solvent, water, or a mixture thereof can be used without particular limitation. As the non-aqueous solvent in the second electrolytic solution, for example, an organic solvent that can be uniformly mixed with water such as ethylene glycol, glycerin, ethanol, isopropyl alcohol, and a combination thereof can be preferably used. Of these solvents, ethylene glycol, glycerin, or a combination thereof can be particularly preferably used. Water can be preferably used because water acts as an oxide ion source with respect to titanium. Deionized water or pure water can be preferably used as the water. In one exemplary embodiment, a mixed solvent including more than 0% by mass and 95% by mass or less of the non-aqueous solvent and 5% by mass or more and less than 100% by mass of water relative to the entire amount of the solvent can be preferably used as the solvent for the second electrolytic solution. In another exemplary embodiment, a solvent composed of water can be preferably used as the solvent of the second electrolytic solution.

As the solute of the second electrolytic solution, for example, an electrolyte such as hydrogen peroxide, hydrogen chloride, formic acid, oxalic acid, phosphoric acid, or a phosphate (for example, potassium phosphate) can be used without particular limitation. Of these solutes, hydrogen peroxide, formic acid, or a combination thereof can be preferably used. The solutes may be used in combination of two or more. In the case where the solvent does not have the oxide ion-donating ability with respect to titanium, however, the second electrolytic solution preferably includes the solute or ion having the oxide ion-donating ability or the solute or ion providing chemical species having the oxide ion-donating ability by subjecting to reduction at the cathode (for example, a hydroxide ion, a peroxide ion, a carboxylate ion, and a phosphate ion).

Hydrogen peroxide provides a hydroxide ion ($OH^-$) by being reduced at the cathode. The hydroxide ion enhances the conductivity while the liquid property of the second electrolytic solution is being led to basicity and also acts as the supply source of an oxide ion ($O^{2-}$) with respect to titanium. As described above, according to hydrogen peroxide, the conductivity and the supply source of oxide ions can be secured while an increase in chemical species other than hydrogen ions that do not contribute to the necessary reaction is being reduced and thus hydrogen peroxide is particularly preferably used as the solute of the second electrolytic solution.

In one preferable exemplary embodiment, the second electrolytic solution includes 89.9% to 99.6% by mass of ethylene glycol, 0.1% to 3% by mass of hydrogen peroxide, and 0.3% to 10% by mass of water relative to the entire amount of the electrolytic solution.

In the second anodizing step S22, the temperature of the second electrolytic solution is maintained at 70° C. or less and preferably 50° C. or less. The temperature of the second electrolytic solution equal to or lower than the upper limit allows a thicker anodized titanium layer to be formed and thus the withstand voltage property to be improved. From the viewpoint of the reaction rate, the temperature of the second electrolytic solution is usually 0° C. or more and preferably 5° C. or more. In controlling the temperature of the second electrolytic solution, a known heating device or cooling device used for the electrolytic tank can be used without particular limitation.

In the second anodizing step S22, the electrolysis voltage is 200 V or less, preferably 155 V or less, more preferably 140 V or less, and particularly preferably 130 V or less. In the second anodizing step S22, the micro-arc oxidation may occur or does not necessarily occur. Generation of the micro-arc oxidation in step S22 results in generation of coarse voids having a pore size of 1 μm or more in the second anodized titanium layer. The electrolysis voltage equal to or lower than the upper limit allows a situation where excessive micro-arc oxidation occurs and thus the adhesion between the titanium base material and the anodized titanium layer deteriorates to be prevented. The lower limit of the electrolysis voltage is usually 40 V or more and preferably 70 V or more.

In the second anodizing step S22, the relative flow rate of the second electrolytic solution with respect to the processed material is maintained at 1 cm/sec or more and 5 cm/sec or less. The relative flow rate means a relative velocity of the electrolytic solution with respect to the processed material immediately before the electrolytic solution reaches the processed material and the measuring method thereof is as described above in the first anodizing step S21. The relative flow rate of the second electrolytic solution equal to or more than the lower limit allows a situation where substrate temperature excessively rises to be prevented and a reagent to be efficiently supplied to the member surface. Consequently, a thicker anodized titanium layer can be formed to improve the withstand voltage property. The relative flow rate of the second electrolytic solution equal to or less than the upper limit allows the uniformity of the film thickness of the anodized titanium layer to be improved.

In the second anodizing step S22, an electrolysis current density is preferably 1 $mA/cm^2$ or more and more preferably 5 $mA/cm^2$ or more and preferably 100 $mA/cm^2$ or less and more preferably 50 $mA/cm^2$ or less as a value determined by dividing the electrolysis current by the area of the titanium surface of the processed material. The electrolysis current density equal to or higher than the lower limit facilitates the withstand voltage property to be improved by increasing the generation rate of titanium oxide to form a thicker second anodized titanium layer. The electrolysis current density equal to or less than the upper limit allows a dense and smooth anodized coated film to be produced.

In the anodizing step S20', the electrolysis time in the first anodizing step S21 and the second anodizing step S22 cannot be unconditionally determined because the electrolysis time depends on other conditions such as the composition, temperature, and flow rate of the electrolytic solution, and the electrolysis voltage. The electrolysis time is preferably determined so that the entire thickness of the anodized titanium layer (for example, the total thickness of the first anodized titanium layer grown in the first anodizing step S21 and the second anodized titanium layer grown in the second anodizing step S22) is 20 μm or more and less than 80 μm. For example, the electrolysis time in the second anodizing step S22 can be determined to be a time when the thickness of the second anodized titanium layer is preferably 0.1 to 5 μm, more preferably 0.5 to 3 μm, and further preferably 1 to 3 μm. Excessively short electrolysis time results in insufficient film thickness growth of the anodized titanium layer, whereas excessively long electrolysis time results in a thickness increase that is not comparable to the electrolysis time. Appropriate electrolysis times can be easily determined by preliminary experiments.

After the first anodizing step S21, the processed material may be directly subjected to the second anodizing step S22 without being washed, or after completion of the first anodizing step S21, the washing process may be performed before the second anodizing step S22 in order to remove the first electrolytic solution from the surface of the processed material. From the viewpoint of enhancing the adhesion of the anodized titanium layer, however, after completion of the first anodizing step S21, the washing process before the second anodizing step S22 is not performed or even when the washing process is performed, the washing process is performed at a minimum. The washing time may be determined to be, for example, preferably less than 60 seconds and more preferably less than 10 seconds. As the washing liquid, for example, known neutral solvents such as water, ethanol, ethylene glycol, acetone, and isopropyl alcohol can be preferably used as the washing liquid. Of these washing liquids, the neutral organic solvents such as ethanol, ethylene glycol and acetone can be preferably used as the washing liquid from the viewpoint of enhancing the adhesion of the anodized titanium layer.

After completion of the anodizing step S20', the washing process may be further performed in order to remove the electrolytic solution from the surface of the processed material. In the washing process, a known solvent such as water, ethanol, ethylene glycol, acetone, and isopropyl alcohol can be used as the washing liquid.

Figure 3:
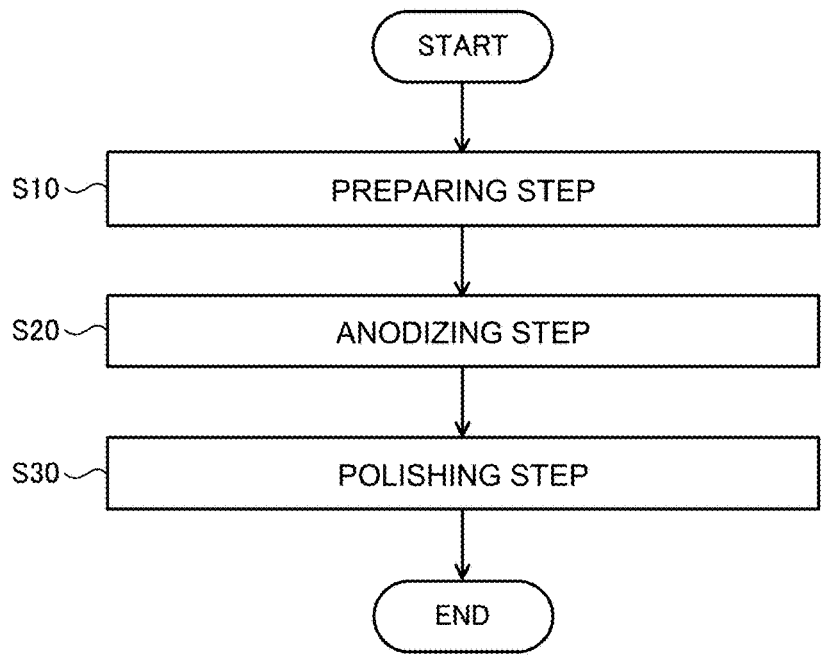
FIG. 3 is a flowchart illustrating a method S300 for producing an anodized titanium material according to another exemplary embodiment of the present disclosure.

In the above description with respect to the present disclosure, the methods S100 and S200 for producing the anodized titanium material including the preparing step S10 and the anodizing step S20 or S20' are exemplified. The present disclosure, however, is not limited to these exemplary embodiments. For example, as the method for producing the anodized titanium material, a production method having an aspect of further including a step of polishing the surface of the anodized layer after the anodizing step can be exemplified. FIG. 3 is a flowchart illustrating a method S300 for producing an anodized titanium material (hereinafter, may be referred to as the "production method S300") according to another exemplary embodiment as described above. In FIG. 3, the same reference signs in FIGS. 1 and 2 may be assigned to the elements already illustrated in FIGS. 1 and 2, and description thereof may be omitted. The production method S300 includes a polishing step S30 in addition to the above-described preparing step S10 and anodizing step S20.

The polishing step S30 is a step of polishing the surface of the anodized titanium layer formed in the anodizing step S20 after the anodizing step S20. By subjecting to the polishing step S30, residues on the surface of the anodized titanium layer can be removed and the surface smoothness can be further improved. As a polishing method in the polishing step S30, a known polishing method such as polishing with abrasive paper or buff polishing can be used without particular limitation. In the polishing step S30, polishing is preferably performed so that the arithmetic average roughness Ra of the surface of the anodized titanium layer is less than 1.6 μm and more preferably less than 0.8 μm and the maximum height roughness Rz of the surface is less than 6.3 μm and more preferably 3.2 μm. In the present specification, the arithmetic average roughness Ra and the maximum height roughness Rz mean the arithmetic average roughness Ra and the maximum height roughness Rz specified in JIS B0601, respectively.

After the polishing step S30, the washing process may be further performed in order to remove polishing debris and the like. In the washing process, a known solvent such as water, ethanol, acetone, or the like can be used as the washing liquid.

<Anodized Titanium Material>

Figure 4:
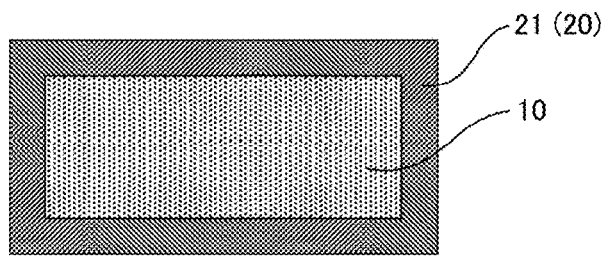
FIG. 4 is a sectional view schematically illustrating an anodized titanium material 100 according to one exemplary embodiment of the present disclosure.

FIG. 4 is a sectional view schematically illustrating the anodized titanium material 100 according to one exemplary embodiment of the present disclosure. The anodized titanium material 100 includes a titanium base material 10; an anodized titanium layer 20 provided on the surface of the titanium base material 10, in which the anodized titanium layer 20 includes a porous first anodized titanium layer 21; the anodized titanium layer 20 has a withstand voltage at 25° C. of 500 V or more, a Vickers hardness of 200 or more, a film thickness of 20 μm or more and less than 80 μm, an arithmetic average roughness Ra of the surface of less than 1.6 μm, and a maximum height roughness of the surface Rz of less than 6.3 μm; and in both of a section perpendicular to a thickness direction of the anodized titanium layer 20 and the surface, no pore sections having a shape capable of including a circle having a diameter of 0.5 μm or more are observed. Such an anodized titanium material 100 can be obtained by the above-described method S100 (FIG. 1) for producing the anodized titanium material.

The withstand voltage at 25° C. of the anodized titanium layer 20 is 500 V or more and preferably 1,000 V or more. The upper limit of the withstand voltage at 25° C. is not particularly limited. The upper limit is usually 5,000 V or less, and preferably 3,000 V or less from the viewpoint of ease of production. The anodized titanium material 100 includes the anodized titanium layer 20 having the improved withstand voltage property and thus can be preferably used for applications to which a high voltage is applied, for example, applications to be exposed to a plasma atmosphere. In the present specification, the withstand voltage of the anodized titanium layer means a withstand voltage measured as the last applied voltage that does not cause dielectric breakdown of the anodized titanium layer when a direct-current voltage is applied between the base material and the surface of the anodized titanium layer while the voltage is being increased until the anodized titanium layer causes dielectric breakdown.

The Vickers hardness of the anodized titanium layer 20 is 200 or more and preferably 250 or more. In the present specification, the Vickers hardness of the anodized titanium layer means a Vickers hardness measured at the surface of the anodized titanium layer by a micro-Vickers hardness test in accordance with JIS Z2244.

The film thickness of the anodized titanium layer 20 is 20 μm or more and less than 80 μm, preferably 25 μm or more, and more preferably 40 µm or more and preferably less than 60 µm. The anodized titanium layer having a film thickness equal to or more than the lower limit allows the withstand voltage property to be improved. An anodized titanium layer 20 having a film thickness of 80 µm or more is difficult to obtain. The film thickness of the anodized titanium layer can be measured with an eddy current type film thickness meter (for example, Type MP2/O, manufactured by Helmut-Fischer GmbH).

The arithmetic average roughness Ra of the surface of the anodized titanium layer 20 is less than 1.6 µm and preferably less than 0.8 µm. The lower limit thereof is not particularly limited. For example, the lower limit is 0.1 µm or more.

The maximum height roughness Rz of the surface of the anodized titanium layer 20 is less than 6.3 µm and preferably less than 3.2 µm. The lower limit thereof is not particularly limited. For example, the lower limit is 1 µm or more.

The anodized titanium material 100 including the anodized titanium layer 20 in which the arithmetic average roughness Ra of the surface and the maximum height roughness Rz of the surface are less than the upper limits has high surface smoothness and thus can be preferably used for a member requiring a vacuum sealing property in a vacuum apparatus. In this specification, the arithmetic average roughness Ra and the maximum height roughness Rz of the surface mean the arithmetic average roughness and the maximum height roughness specified in JIS B0601, respectively.

In both of the section perpendicular to the thickness direction and the surface of the first anodized titanium layer 21, no pore sections having a shape capable of including a circle having a diameter of 0.5 µm or more are observed. In both of the section perpendicular to the thickness direction and the surface of the first anodized titanium layer 21, no pore sections having a shape capable of including a circle having a diameter of 0.4 µm or more are preferably observed. That in both of the section perpendicular to the thickness direction and the surface of the first anodized titanium layer 21, no pore sections having a shape capable of including a circle having the diameter having the predetermined value or more are observed can be determined by observing no pore sections (opening parts) having a shape capable of including a circle having the diameter of the predetermined value or more in both of the scanning electron microscope image (SEM image) of the surface of the anodized titanium layer of the anodized titanium material and the SEM image of the polished surface of the anodized titanium layer of the anodized titanium material. The conditions for the SEM observation can be determined to be, for example, an acceleration voltage of 5.0 to 10.0 kV, a detection mode of backscattered electron detection, and a magnification of 10,000 times. According to the first anodized titanium layer 21 including no coarse voids having the above-described pore sections, the film has high uniformity and thus the withstand voltage property can be improved. The first anodized titanium layer 21 includes a plurality of tubular pores extending in a direction intersecting the surface of the anodized titanium layer 20. In other words, the first anodized titanium layer 21 has a large number of tube-shaped or cone-shaped pores grown in the thickness direction. The size (diameter) of each of the tube-shaped pores usually becomes larger as the pore becomes closer to the surface layer part, whereas becomes smaller as the pore becomes closer to the titanium base material 10. The section of each of the tubular pores perpendicular to the longer direction (extending direction) has a shape close to a circle. The diameter thereof (or the diameter in the major axis direction if the section is not a perfect circle) is usually 0.3 µm or less and typically 0.2 µm or less. On the other hand, for example, in the case where the micro-arc oxidation occurs during the growth of the anodized titanium layer, coarse voids remain at locations where the micro-arc oxidation occurs regardless of the position in the thickness direction. The action of micro-arc oxidation to form the voids is generally isotropic in an in-plane direction (that is, a direction perpendicular to the thickness direction of the anodized titanium layer) and thus the pore sections or opening parts having a relatively high degree of circularity appear at the section perpendicular to the thickness direction or the surface of the anodized titanium layer. Therefore, the voids generated by the micro-arc oxidation have the pore sections (or opening parts) having a shape capable of including a circle having a diameter equal to or more than the lower limit in the section perpendicular to the thickness direction or the surface of the anodized titanium layer.

The anodized titanium layer 20 has a unique property that the withstand voltage becomes lowest around room temperature (25° C.), increases at a higher temperature than room temperature, and increases at a lower temperature than room temperature. In other words, the anodized titanium layer 20 has a property in which the withstand voltage at 150° C. is higher than the withstand voltage at 25° C., which is opposite to the property of the conventionally known alumite coated film. Although not limited by theory, the property in which the withstand voltage increases at high temperature is considered to be caused by shrinking the large number of pores growing in the tube shape or the cone shape in the thickness direction included in the anodized titanium layer 20 when the temperature rises from room temperature.

Figure 5:
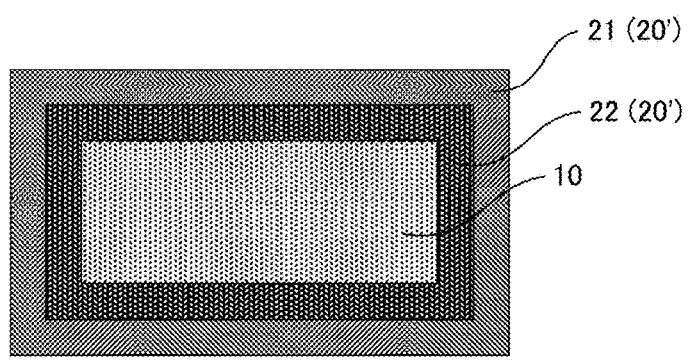
FIG. 5 is a sectional view schematically illustrating an anodized titanium material 200 according to one exemplary embodiment of the present disclosure.

FIG. 5 is a sectional view schematically illustrating an anodized titanium material 200 according to another exemplary embodiment of the present disclosure. In FIG. 5, the same reference signs in FIG. 4 are assigned to the elements already illustrated in FIG. 4 and description thereof is omitted. The anodized titanium material 200 is different from the anodized titanium material 100 in that an anodized titanium layer 20' is provided instead of the anodized titanium layer 20 formed of the first anodized titanium layer 21. The anodized titanium layer 20' further includes a second anodized titanium layer 22 provided between the titanium base material 10 and the first anodized titanium layer 21 in addition to the first anodized titanium layer 21. Such an anodized titanium layer 200 can be obtained by the above-described method S200 for producing the anodized titanium material.

The first anodized titanium layer 21 is as described above in relation to the anodized titanium material 100. The withstand voltage, Vickers hardness, film thickness, and arithmetic average roughness Ra and maximum height roughness Rz of the surface of the anodized titanium layer 20' are the same as those of the anodized titanium layer 20 described above.

The film thickness of the second anodized titanium layer 22 is preferably 0.1 to 5 µm, more preferably 0.5 to 3 µm, and further preferably 1 to 3 µm. The anodized titanium layer having the film thickness of the second anodized titanium layer 22 equal to or more than the above lower limit facilitates the withstand voltage property and the adhesion of the anodized titanium layer 20' to be improved. A second anodized titanium layer 22 having a film thickness of 5 µm or more is usually difficult to obtain. The film thickness of the second anodized titanium layer 22 can be measured by obtaining the scanning electron microscope image (SEM image) of the section of the anodized titanium material perpendicular to the surface of the anodized titanium layer. The conditions for the SEM observation in confirming the film thickness can be, for example, an acceleration voltage of 15.0 kV, a detection mode of backscattered electron detection, and a magnification of 10,000 times.

The second anodized titanium layer 22 may be porous or is not necessarily porous and is preferably porous. The porous second anodized titanium layer 22 facilitates the film thickness of the second anodized titanium layer 22 to increase and thus the withstand voltage property of the anodized titanium layer 20' to be improved.

The fluorine content (unit: atomic %) in the second anodized titanium layer 22 is lower than the fluorine content (unit: atomic %) in the first anodized titanium layer 21. The fluorine contents (unit: atomics) in the first anodized titanium layer 21 and the second anodized titanium layer 22 can be measured by performing energy dispersive X-ray spectroscopy (EDS) measurement in the section of the anodized titanium material 200. EDS measurement conditions in measuring the fluorine content in each of the anodized titanium layers can be determined to be, for example, an acceleration voltage of 15.0 kV. Excessively high acceleration voltage results in deterioration in the detection sensitivity for light elements such as oxygen and fluorine, whereas excessively low acceleration voltage results in improved sensitivity for the light elements while the detection sensitivity for heavy elements such as titanium deteriorates.

In the EDS measurement, a region where electron beams incident on the titanium oxide are scattered in the titanium oxide to generate characteristic X-rays exists, for example, over at least about 1 µm in diameter at an acceleration voltage of 15.0 kV. Therefore, a sufficient film thickness of the second anodized titanium layer 22 allows the fluorine content (atomic %) of the second anodized titanium layer 22 itself to be measured by EDS. In the case where the film thickness of the second anodized titanium layer 22 is thin (for example, a film thickness of 1 µm or less), the characteristic X-rays are generated not only from the second anodized titanium layer 22 but also from the first anodized titanium layer 21 even when the electron beams are incident on the second anodized titanium layer 22. Therefore, the characteristic X-rays derived from F elements in the first anodized titanium layer 21 are generated regardless of the fluorine content in the second anodized titanium layer 22. As a result, the fluorine content of the second anodized titanium layer 22 itself may be difficult to measure. Even in such a case, however, that the fluorine content in the second anodized titanium layer 22 is lower than the fluorine content in the first anodized titanium layer 21 can be confirmed by confirming that the measured value of the fluorine content in the case where the electron beams are incident on the second anodized titanium layer 22 in the EDS measurement is lower than the measured value of the fluorine content in the case where the electron beams are incident on the first anodized titanium layer 21.

In the EDS measurement, the region where the electron beams incident on the titanium oxide are scattered in the titanium oxide to generate characteristic X-rays becomes narrower as the acceleration voltage becomes lower. Therefore, in the case where the film thickness of the second anodized titanium layer 22 is thin, the acceleration voltage may be lowered to, for example, 5.0 kV in order to exclude the titanium base material 10 in a range where the characteristic X-rays are generated when the electron beams are incident on the second anodized titanium layer 22.

When the inventors of the present disclosure actually analyze one of the anodized titanium materials 200 (the film thickness of the second anodized titanium layer 22: about 2 µm) produced by the above-described production method S200, the fluorine content in the section of the anodized titanium material measured by irradiating the first anodized titanium layer 21 with electron beams (acceleration voltage: 15.0 kV) is about 8 atomic %, whereas the fluorine content in the second anodized titanium layer 22 measured by irradiating the first anodized titanium layer 21 side from the intermediate line between the first anodized titanium layer 21 and the titanium base material 10 with the electron beams is around 2 atomic %. In addition, the fluorine content in the second anodized titanium layer 22 measured by irradiating the titanium base material 10 side from the above-described intermediate line with the electron beams is less than the detection limit (0.1 atomic %). From these results, it is considered that the actual fluorine content in the second anodized titanium layer 22 is less than the detection limit (0.1 atomic %) of the EDS measurement and the second anodized titanium layer 22 substantially includes no fluorine.

The irradiated locations of electron beams at the time of measuring the fluorine content in the first anodized titanium layer 21 by EDS are determined to be locations apart from the interface between the first anodized titanium layer 21 and the second anodized titanium layer 22 in the film thickness direction at a distance of 3 to 5 µm. In this region, the measured value is not affected by the second anodized titanium layer 22 and the measured value is less likely to be affected by the pores. In the EDS measurement, the fluorine content of the first anodized titanium layer 21 measured by irradiating this region with the electron beams may vary depending on the conditions of the anodization and the composition of the used electrolytic solution and thus is difficult to unconditionally specify. For example, the fluorine content may be atomic % to 20 atomic %.

According to the anodized titanium material 200 including the anodized titanium layer 20' further including the second anodized titanium layer 22 in addition to the first anodized titanium layer 21, the adhesion between the anodized titanium layer 20' and the titanium base material 10 can be enhanced and, in addition, the withstand voltage property of the anodized titanium layer 20' can be further improved.

Figure 6:
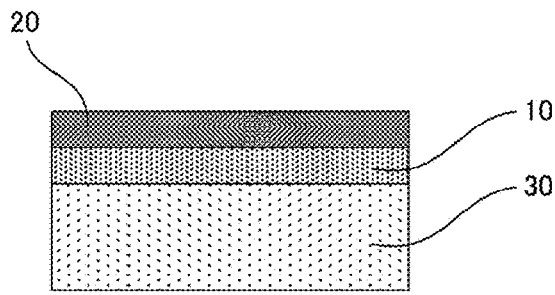
FIG. 6 is a sectional view schematically illustrating an anodized titanium material 300 according to one exemplary embodiment of the present disclosure.

FIG. 6 is a sectional view schematically illustrating an anodized titanium material 300 according to another exemplary embodiment of the present disclosure. In FIG. 6, the same reference signs in FIGS. 4 and 5 are assigned to the elements already illustrated in FIGS. 4 and 5 and description thereof is omitted. The anodized titanium material 300 further includes a metal base material 30 made of a metal other than titanium in addition to the titanium base material 10 and the anodized titanium layer 20 described above. The titanium base material 10 is provided on the surface of the metal base material 30. Such an anodized titanium material 300 can be obtained, for example, by the anodized titanium material production method S100 in which the above-described preparing step S10 includes a step of forming a titanium layer on the surface of the metal base material other than titanium.

Examples of the metal constituting the metal base material 30 include aluminum, stainless steel, or a combination thereof.

The lower limit of the thickness of the titanium base material 10 in the laminating direction of the metal base material 30, the titanium base material 10, and the anodized titanium layer 20 (that is, the vertical direction in the drawing of FIG. 4) is not particularly limited. From the viewpoint of ease of production, for example, the lower limit may be 0.1 μm or more and preferably 5 μm or more. The upper limit of the thickness of the titanium base material 10 in the laminating direction is also not particularly limited. From the viewpoint of ease of production, for example, the upper limit may be 100 μm or less. In the case where the anodized titanium material 300 is obtained by the production method S300, the anodized titanium layer 20 is grown by oxidizing the titanium of the titanium layer formed on the surface of the metal base material 30 in the preparing step S10 and thus the thickness of the titanium base material 10 in the obtained anodized titanium material 300 is thinner than the titanium layer formed in the preparing step S10.

The anodized titanium materials 100, 200, and 300 according to the present disclosure described above have thermal expansion coefficients of the anodized titanium layers 20 and 20' close to the thermal expansion coefficient of the titanium base material 10 and thus in the anodized titanium layers 20 and 20' cracks are less easily generated. The anodized titanium layers 20 and 20' have the improved withstand voltage property and thus are preferably used for applications in which high voltage is applied between the titanium base material 10 and the anodized titanium layers 20 and 20' (for example, applications exposed to a plasma atmosphere and the electrostatic chuck). The anodized titanium layers 20 and 20' have sufficient hardness and surface smoothness and thus can also be preferably used as a vacuum apparatus member requiring a vacuum sealing property. Examples of the vacuum apparatus member requiring the vacuum sealing property include the electrostatic chuck of the plasma etching apparatus and other components (for example, a chamber and a lower electrode that is provided below the electrostatic chuck and to which the high-frequency voltage is applied for generating plasma, a base, an upper electrode, a cooling plate, and a heating plate) in a process chamber. As the material of the lower electrode and the pedestal of the conventional plasma etching apparatus, aluminum having a coated oxide film on the surface has been used. Replacement of such aluminum with the anodized titanium material according to the present disclosure particularly allows durability of the apparatus at high and low temperature to be further improved.

<Electrostatic Chuck, Cooling Plate, and Shower Head for Plasma Etching Apparatus>

Figure 7:
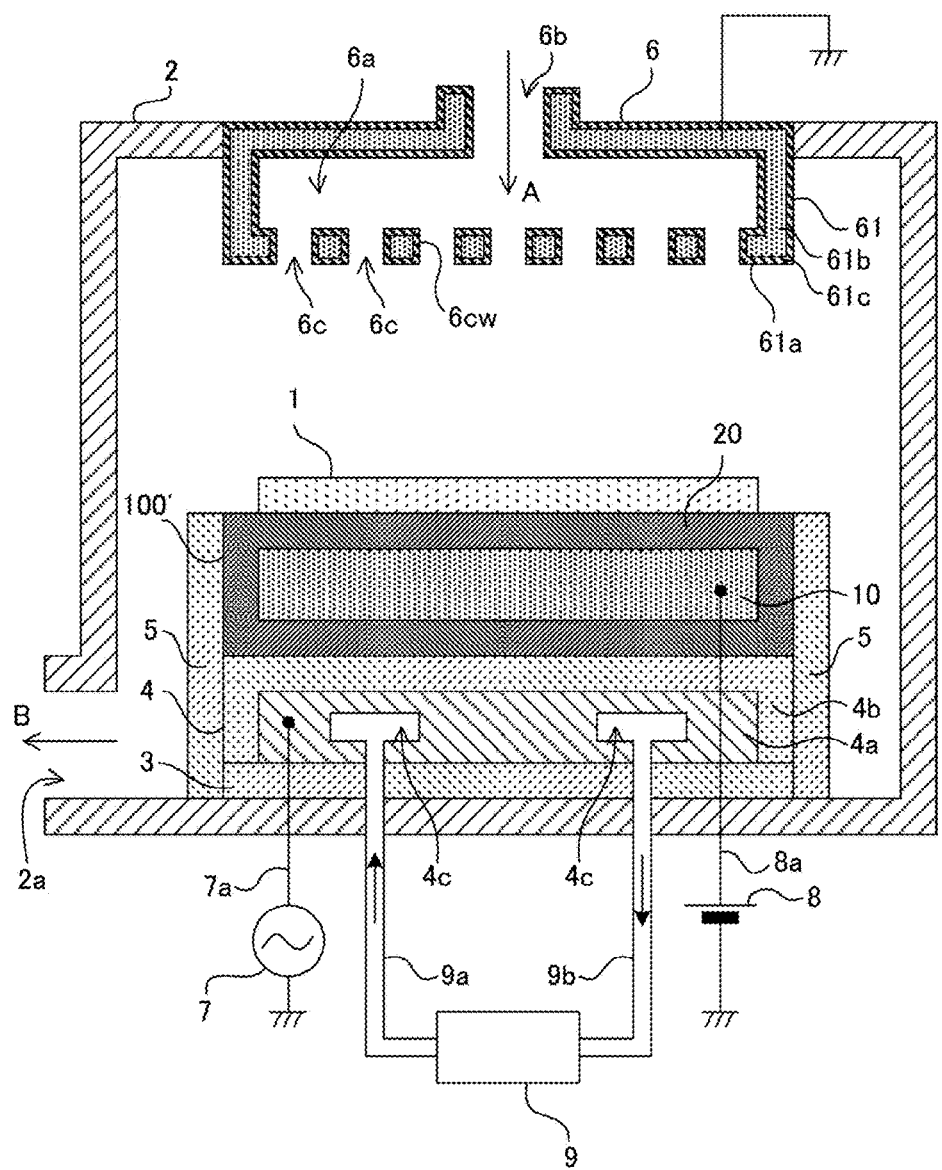
FIG. 7 is a sectional view schematically illustrating an electrostatic chuck 100' according to one exemplary embodiment of the present disclosure together with a plasma etching apparatus 1000.

FIG. 7 is a sectional view schematically illustrating an electrostatic chuck 100' for a plasma etching apparatus according to one exemplary embodiment of the present disclosure (hereinafter may be simply referred to as the "electrostatic chuck 100'"), a cooling plate 4 for a plasma etching apparatus according to one exemplary embodiment of the present disclosure (hereinafter may be simply referred to as the "cooling plate 4"), a shower head 6 according to one exemplary embodiment of the present disclosure (hereinafter may be simply referred to as the "shower head 6"), and a plasma etching apparatus 1000 including the electrostatic chuck 100', the cooling plate 4, and the shower head 6. In FIG. 7, the same reference signs in FIGS. 4 to 6 are assigned to the elements already illustrated in FIGS. 4 to 6 and description thereof is omitted. The plasma etching apparatus 1000 is configured as a capacitively coupled parallel plate type plasma etching apparatus for etching a substrate 1 (for example, a silicon wafer). The plasma etching apparatus 1000 includes a chamber 2 formed into a rectangular cylindrical shape made of aluminum the surface of which is subjected to the alumite process (anodizing process), a prismatic insulating plate 3 made of an insulating material placed at the bottom of the chamber 2, the cooling plate (susceptor) 4 placed on the insulating plate 3, an insulating material 5 placed on the outer periphery of the cooling plate 4, and the electrostatic chuck 100' placed on the cooling plate 4.

The cooling plate (susceptor) 4 includes a conductive susceptor base material 4a, an insulating film 4b provided on the surface of the susceptor base material 4a, and a refrigerant channel 4c provided in the internal part of the susceptor base material 4a. The refrigerant such as a fluorine-based liquid is introduced into the refrigerant channel 4c through the refrigerant introduction pipe 9a. The refrigerant introduced into the refrigerant channel 4c takes heat from the susceptor base material 4a, thereafter flows out through a refrigerant recovery pipe 9b, is cooled by a chiller 9 provided outside the plasma etching apparatus 1000, and is introduced again to the refrigerant channel 4c through the refrigerant introduction pipe 9a.

The cooling plate (susceptor) 4 includes the anodized titanium material according to the present disclosure. The susceptor base material 4a is the titanium base material (10) and an insulating film 4b provided on the surface of the susceptor base material 4a is the anodized titanium layer (20). With respect to the insulating film 4b, which is the anodized titanium layer, when high-frequency voltage from a high-frequency power supply 7 is applied to the adjacent susceptor base material 4a (titanium base material) during the plasma etching process, occurrence of the dielectric breakdown of the insulating film 4b is prevented even during plasma etching because the insulating film 4b (anodized titanium layer) has the improved withstand voltage property.

Above the cooling plate (susceptor) 4, the shower head 6 that functions as the upper electrode is placed in parallel with and facing the cooling plate (susceptor) 4. The shower head 6 is supported on the upper part of the chamber 2 and includes a wall member 61 defining an internal space 6a. The wall member 61 has at least a bottom surface 61a. The wall member 61 has a gas introduction port 6b through which a processing gas for plasma etching flows into the internal space 6a and a plurality of gas discharge holes 6c, 6c, . . . (hereinafter, may be simply referred to as the "gas discharge holes 6c") provided in the bottom surface 61a and through which the processing gas flows out of the internal space 6a. The shower head 6 is grounded and constitutes a pair of parallel plate electrodes together with the susceptor 4. The gas introduction port 6b is connected to a processing gas supply source (not illustrated) and the processing gas for etching is supplied from the processing gas supply source (arrow A). As the processing gas, a known gas used as processing gas for plasma etching such as a halogen-based gas, an $O_2$ gas, and an Ar gas can be used without particular limitation.

The shower head (upper electrode) 6 includes the anodized titanium material according to the present disclosure and the wall member 61 is configured by the anodized titanium material according to the present disclosure. In other words, the wall member 61 includes a titanium base material 61b (10) and a anodized titanium layer 61c (20) provided on the surface of the titanium base material 61b. The titanium base material 61b is grounded and functions as an electrode as described above. The anodized titanium layer 61c is exposed at least at the inner peripheral surface 6cw of each of the gas discharge holes 6c of the shower head 6.

In general, it is difficult to provide a robust protective film such as a ceramic sprayed film on the inner peripheral surfaces of the gas discharge holes of the shower head for the plasma etching apparatus. On the inner peripheral surfaces 6cw of the gas discharge holes 6c of the shower head 6, however, the anodized titanium layer 61c functions as the protective film. Generation of cracks can be prevented even under the conditions of the plasma etching process because the anodized titanium material according to the present disclosure has high heat resistance due to small difference in the thermal expansion coefficients between the titanium base material and the anodized titanium layer. Therefore, according to the shower head 6, the inner peripheral surfaces 6cw of the gas discharge holes can be appropriately protected even under the condition of the plasma etching process.

The outer surface of the wall member 61 (for example, the bottom surface 61a serving as a plasma exposure surface) may be covered with a protective member made of, for example, single crystal silicon or quartz or may be covered with, for example, a ceramic sprayed film. Preferable examples of the ceramic material that covers the outer surface of the wall member 61 (for example, the bottom surface 61a) include a plasma sprayed coating film made of materials such as $Al_2O_3$, $Y_2O_3$, $YF_3$, and YAG (yttrium aluminum garnet).

An exhaust port 2a is provided at a lower part of the side wall of the chamber 2 and is connected to an exhaust device (not illustrated). The exhaust device includes a vacuum pump such as a turbo-molecular pump and is configured to exhaust the atmosphere in the chamber 2 (arrow B) to reduce the pressure of the internal part of the chamber 2 to a predetermined pressure.

The susceptor base material 4a of the susceptor 4 is connected to a high-frequency power supply 7 via a power supply line 7a. For example, a high frequency power of 13.56 MHz is supplied from the high-frequency power supply 7 to the susceptor 4.

The electrostatic chuck 100' has a rectangular shape in a plan view and includes the anodized titanium material 100 having the above-described titanium base material 10 and the anodized titanium layer 20 provided on the surface of the titanium base material 10. The anodized titanium layer 20 is provided on the outermost surface of the electrostatic chuck 100'. The titanium base material 10 is connected to a direct-current power supply 8 via a power supply line 8a. In the electrostatic chuck 100', the titanium base material 10 acts as an electrode. By applying direct-current voltage from the direct-current power supply 8 to the titanium base material 10 via the power supply line 8a, the substrate 1 can be electrostatically stuck to the surface of the electrostatic chuck 100' by, for example, Coulomb force or Johnson-Rahbek force. A through hole (not illustrated) is provided at a site of the anodized titanium layer 20 located on the lower surface of the electrostatic chuck 100' and the power supply line 8a is wired through the through hole.

The processing operation of the plasma etching apparatus 1000 will be described. The substrate 1 serving as a processed object is carried in the chamber 2 via a substrate carrying-in and carrying-out port (not illustrated) provided at the side wall of the chamber 2 in a state where the pressure in the chamber 2 is normal pressure and mounted on the electrostatic chuck 100'. Thereafter, the internal part of the chamber 2 is depressurized to a predetermined degree of vacuum by the exhaust device. Thereafter, the processing gas is supplied to the shower head 6 from the processing gas supply source and uniformly discharged to the substrate 1 through the discharge holes 6c and thus the pressure in the chamber 2 is maintained at a predetermined value.

In this state, the high-frequency power from the high-frequency power supply 7 is applied to the susceptor 4, whereby a high-frequency electric field is generated between the susceptor 4 serving as the lower electrode and the shower head 6 serving as the upper electrode, the processing gas is ionized by the high-frequency electric field to generate plasma, and etching process to the substrate 1 is performed by the generated plasma. During this operation, the substrate 1 is stuck and held to the electrostatic chuck 100' by, for example, Coulomb force by applying a predetermined voltage to the titanium base material 10 (electrode) of the electrostatic chuck 100' from the direct-current power supply 8. During performing the etching process, at least a part of the anodized titanium layer 20 is to be exposed to a plasma atmosphere.

After performing the etching process, the supply of the high-frequency power from the high-frequency power supply 7 is stopped, the gas introduction is stopped, and thereafter the pressure at the internal part of the chamber 2 is reduced to a predetermined value. Thereafter, the internal part of the chamber 2 is opened until the pressure becomes normal pressure and the substrate 1 is carried out of the chamber 2 through the substrate carrying-in and carrying-out port (not illustrated). By the above-described operation, the etching process of the substrate 1 is completed. As described above, the substrate 1 can be subjected to the etching process while the substrate 1 is being held by the electrostatic attraction using the electrostatic chuck 100'.

In the above-described electrostatic chuck 100' according to the present disclosure, the thermal expansion coefficient of the anodized titanium layer 20 is close to the thermal expansion coefficient of the titanium base material 10 and thus in the anodized titanium layer 20 cracks are less easily generated even when the anodized titanium layer 20 is exposed to the high temperature environment of plasma etching. When a high voltage is applied between the titanium base material 10 and the anodized titanium layer 20 during the plasma etching, the anodized titanium layer 20 does not cause dielectric breakdown even during the plasma etching because the anodized titanium layer 20 has the improved withstand voltage property. The anodized titanium layer 20 has sufficient hardness and surface smoothness and thus a sufficient vacuum sealing property can be obtained. Therefore, for example, the situation where the lower surface of the substrate 1 is exposed to plasma can be prevented.

Hereinafter, the present disclosure will be described in more detail with reference to Examples. The present disclosure, however, is not limited to Examples described below.
<Evaluation Methods>

The evaluation methods in each Example and Comparative Example are as follows.
(Withstand Voltage Property)

Using an insulation resistance meter IR4051 manufactured by HIOKI E.E. CORPORATION, direct-current voltage that increased stepwise in the order of 50 V, 125 V, 250 V, 500 V, and 1,000 V was applied between the base material and the surface of the anodized titanium layer. The last applied voltage at which the layer did not cause dielectric breakdown was measured as the withstand voltage. In the case where the dielectric breakdown did not occur even at an applied voltage of 1,000 V, the withstand voltage was determined to be "1,000 V or more".
(Vickers Hardness)

The Vickers hardness of the anodized titanium layer was measured using a micro-Vickers hardness tester (HM-114, manufactured by Mitutoyo Corporation (formerly Akashi Corporation)). The measurement was performed at a test load of 10 gf at the surface and the section in accordance with JIS Z2244.

(Surface Smoothness)

The surface roughness (line roughness) of the anodized titanium layer was measured using a high-precision surface roughness shape measuring instrument (Kosaka Laboratory, SE-30K). The arithmetic average roughness Ra and the maximum height roughness Rz were calculated from the measurement results in accordance with JIS B0601.

(Film Thickness)

The total thickness of the anodized titanium layer was measured using an eddy current type film thickness meter (Helmut-Fisher GmbH, Type MP2/O).

(SEM Observation)

In observing the morphology of the surface and section, a field emission type scanning electron microscope (FE-SEM) (JEOL Ltd., JSM-7000F) was used. The conditions for SEM observation of the sectional morphology were determined to be an acceleration voltage of 5.0 kV, a detection mode of backscattered electron detection, and a magnification of 1,000, 2,000, 10,000, and 50,000 times. The conditions for SEM observation of the surface morphology were determined to be an acceleration voltage of 10.0 kV, a detection mode of secondary electron detection, and a magnification of 1,000 and 4,000 times. The samples of the surface and section observation were processed by a flat milling method using an ion milling apparatus (JEOL Ltd., IB-09020CP).

(Adhesion)

The adhesion of the coated film was evaluated by a tape peeling test and an ultrasonic impact test. The tape peeling test was performed in accordance with JIS H8504 (peeling test method: tape test method) and the presence or absence of delamination of the coated film was examined. In the ultrasonic impact test, a sample was immersed in pure water (1 L) in an ultrasonic tank (US-205, manufactured by SND Co., Ltd.) and irradiated with ultrasonic waves at an output of 170 W and a frequency of 28 kHz for 30 minutes to examine the presence or absence of delamination of the coated film.

Example 1

Example 1 is an example in which, using a cold-rolled titanium plate (100 mm×50 mm×thickness 1 mm; surface roughness Ra (μm)=0.439 and Rz (μm)=3.647) as a processed material, a half area thereof having a size of 50 mm×50 mm was subjected to the anodizing process by the production method S100 (FIG. 1) of the anodized titanium material to prepare the anodized titanium material 100 (FIG. 4).

The processed material was subjected to alkaline electrolytic degreasing and etching as the preprocess. The alkaline electrolytic degreasing was performed by using an electrolytic solution obtained by diluting PAKUNA 171-N manufactured by Yuken Industry Co., Ltd. to a concentration of 50 g/L with deionized water and electrolyzing at a current density of 50 mA/cm² for 3 minutes using the processed material as an anode. The etching was performed by immersing the processed material in an aqueous acidic ammonium fluoride solution (concentration: 50 g/L) for 2 minutes.

After the preprocess, the processed material was anodized in the first trolytic solution (Step (b1)). The first electrolytic solution was prepared by dissolving acidic ammonium fluoride in a mixed solvent of ethylene glycol and pure water (mixing volume ratio 95:5) so as to be a concentration of 6 g/L. Into a 5 L beaker (inner diameter 190 mm), 5 L of this electrolytic solution was poured to prepare an electrolysis bath, and the temperature of the electrolytic solution was maintained at 5° C. with a cooling device. The processed material serving as an anode was immersed in the electrolysis bath and the electrolysis was performed for 130 minutes under the conditions of an electrolysis voltage of 130 V and an electrolysis current density of 10 mA/cm² while the electrolytic solution was being stirred at a constant speed with a magnetic stirrer. During the electrolysis, the relative flow rate of the electrolytic solution with respect to the processed material was maintained at 4 cm/sec.

After completion of the electrolysis, the processed material was pulled out of the electrolysis bath, washed with ethanol and pure water, dried with air, and thereafter polished with a No. 4000 wrapping film to give an anodized titanium material 100.

The obtained anodized titanium layer had a film thickness of 43 μm, a Vickers hardness of 260, a withstand voltage at 25° C. of 500 V or more, and a surface roughness Ra of less than 1.6 μm (Ra=0.469 μm and Rz=4.144 μm). Although delamination was partially observed in the tape peeling test, a generally excellent anodized titanium material was obtained.

Figure 8A:
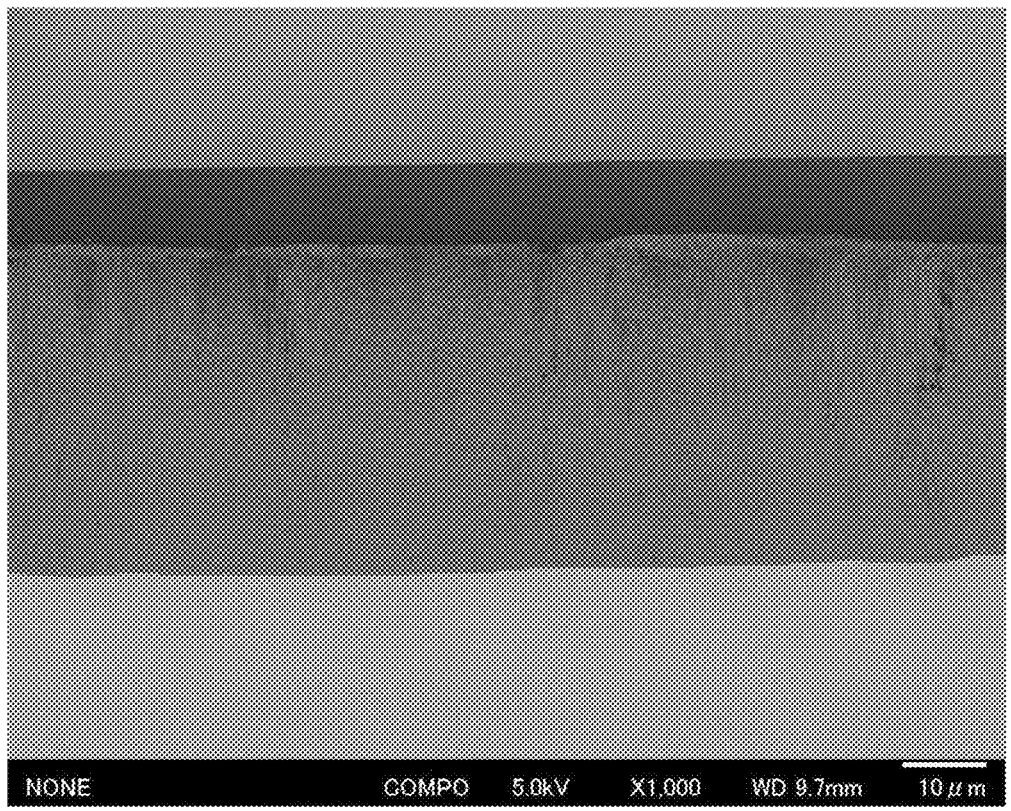
FIG. 8(A) is the sectional SEM image of the anodized titanium material obtained in Example 1.
Figure 8B:
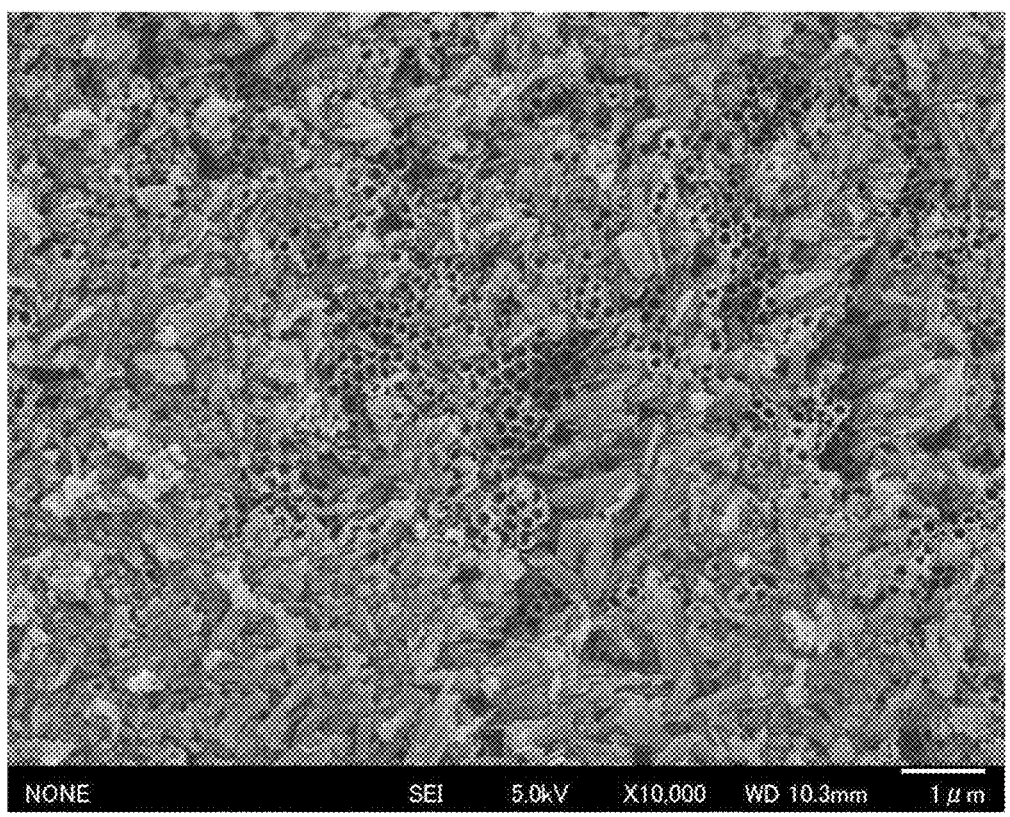
FIG. 8(B) is the surface SEM image of the anodized titanium layer.
Figure 9A:
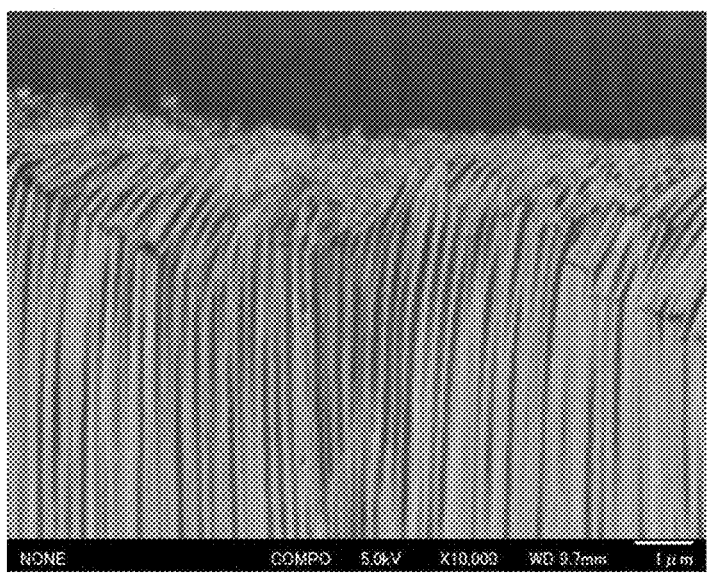
FIGS. 9(A) to 9(C) include high-magnification sectional SEM images of the anodized titanium material obtained in Example 1.
Figure 9B:
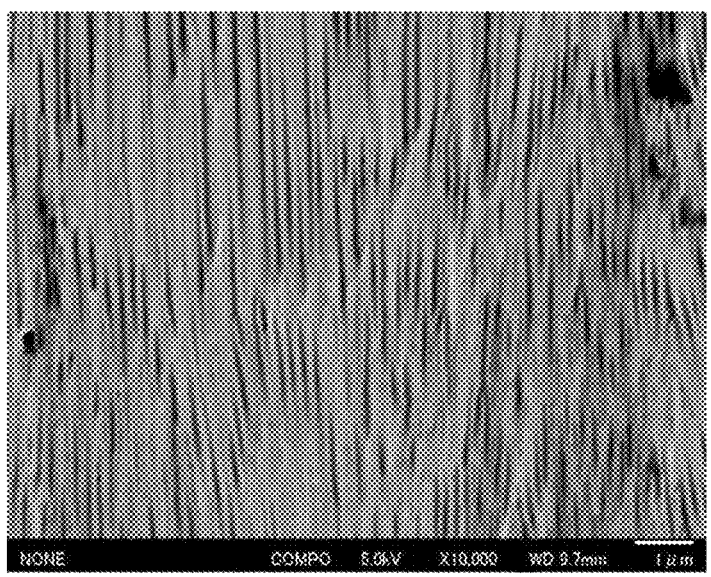
Figure 9C:
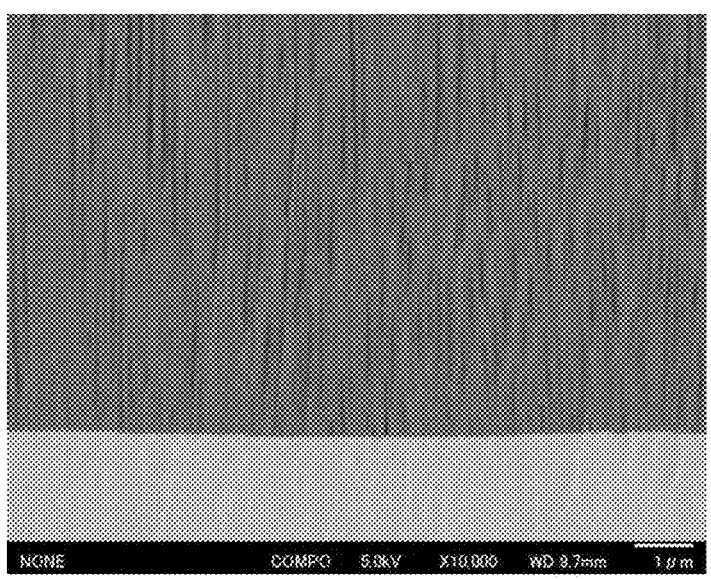

The obtained sectional SEM image (acceleration voltage: 5.0 kV, backscattered electron detection, and magnification: 1,000 times) of the obtained anodized titanium material is illustrated in FIG. 8(A). The surface SEM image (acceleration voltage: 5.0 kV, backscattered electron detection, and magnification: 10,000 times) of the anodized titanium layer of the anodized titanium material is illustrated in FIG. 8(B). The high-magnification sectional SEM images (acceleration voltage: 5.0 kV, backscattered electron detection, and magnification: 10,000 times) of the obtained anodized titanium material are illustrated in FIGS. 9(A) to 9(C). FIG. 9(A) is the sectional SEM image in the vicinity of the surface layer of the anodized titanium layer, FIG. 9(C) is the sectional SEM image in the vicinity of the interface between the anodized titanium layer and the titanium base material, and FIG. 9(B) is the sectional SEM image in the vicinity of the center of the anodized titanium layer. From the sectional SEM image of FIG. 8(A), it can be read that no coarse voids exist in the first anodized titanium layer grown at the step (b1) and that no micro-arc oxidation occurred. From the surface SEM image of FIG. 8(B), it can be read that no pore sections (opening parts) having a shape capable of including a circle having a diameter of 0.5 μm or more are observed on the surface of the first anodized titanium layer and thus this surface SEM image also supports that no micro-arc oxidation occurred. From the sectional SEM images of FIGS. 9(A) to 9(C), it can be read that the first anodized titanium layer grown at the step (b1) is entirely porous, that tubular pores grow in the approximate thickness direction in the first anodized titanium layer, and that the tubular pores tend to have a small pore diameter in the vicinity of the interface with the titanium base material and a large pore diameter in the vicinity of the surface layer.

The surface SEM image of FIG. 8(B) illustrates an end of the structure having tubular pores. In the surface observed in FIG. 8(B), the part where no tubular pores appear is covered with a number of plate-like fragments having a longer direction and a shorter direction and having a surface curved in the shorter direction. These curved plate-shaped fragments are considered to be generated by breaking a region in the vicinity of the end of the tubular structure. In the anodized titanium material according to the present disclosure, the tubular structure constituting the anodized titanium layer has a larger pore diameter and a thinner wall thickness as the structure becomes closer to the surface layer part.

Therefore, these fragments are considered to be generated by breaking the location that is brittle due to reduction in the thickness. As will be described below, these plate-shaped fragments can be removed by polishing.

Figure 10A:
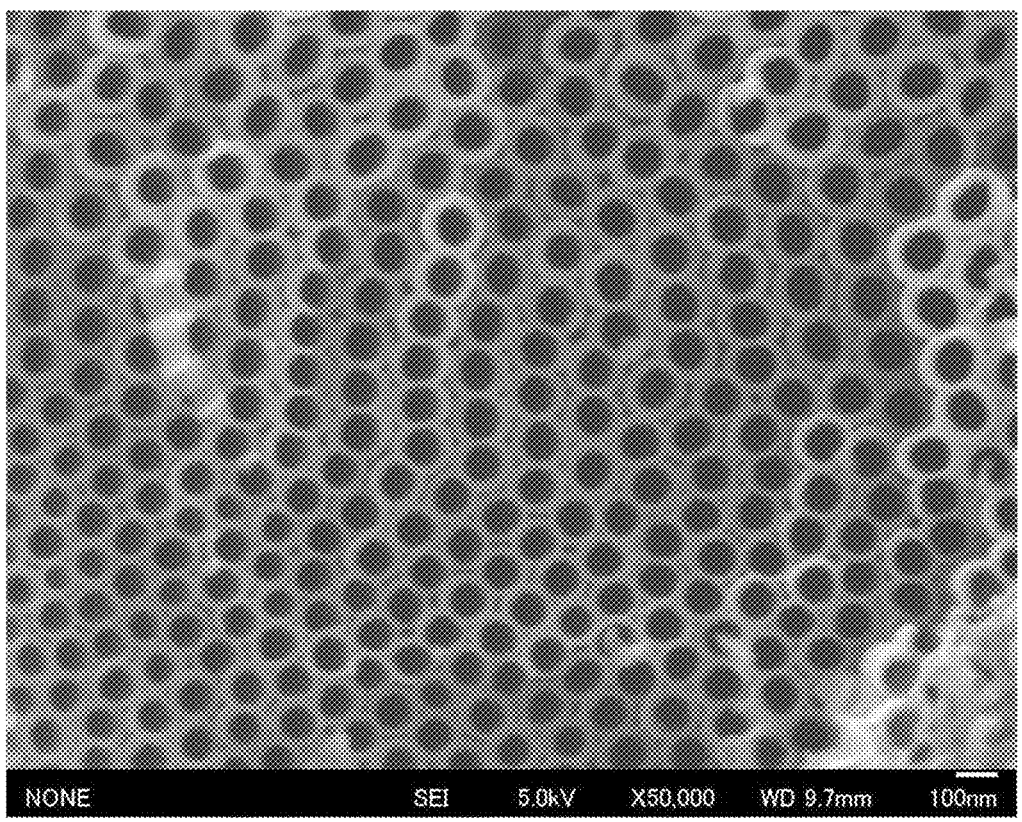
FIGS. 10(A) and 10(B) include the SEM images of the sections perpendicular to the thickness direction of the anodized titanium layer obtained in Example 1.
Figure 10B:
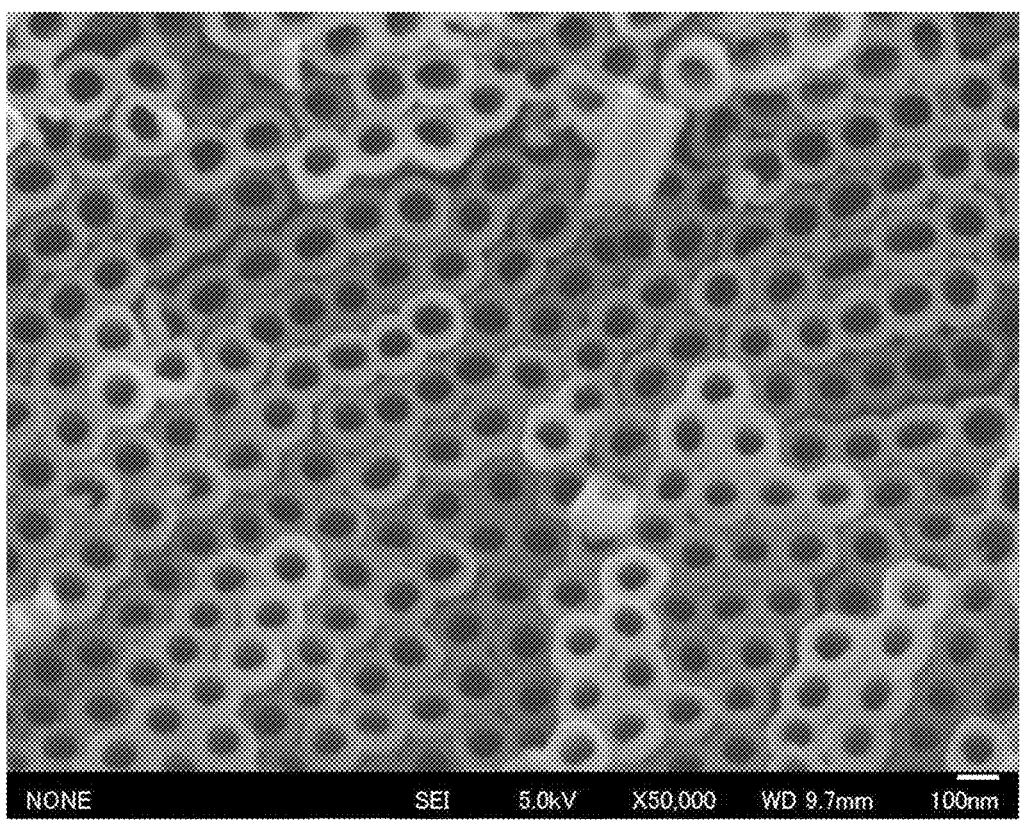

The surface of the obtained anodized titanium material is polished by an ion milling apparatus. The surface SEM image (acceleration voltage: 5.0 kV, backscattered electron detection, and magnification: 50,000 times) of the section perpendicular to the thickness direction of the anodized titanium layer was acquired. The results are illustrated in FIGS. 10 (A) and (B). FIG. 10(A) is the SEM observation result of a relatively shallow location from the surface of the obtained anodized titanium layer and FIG. 10(B) is the SEM observation result of a relatively deep location from the surface of the obtained anodized titanium layer. The plate-shaped fragments observed in the surface SEM image of FIG. 8(B) are removed by the polishing. From FIG. 8(B), FIG. 10 (A), and FIG. 10 (B), it can be read that in the structure having the tubular pores constituting the anodized titanium layer, the pore diameter becomes smaller and the wall thickness becomes thicker as the structure becomes closer to the titanium base material side, whereas the pore diameter becomes larger and the wall thickness becomes thinner as the structure becomes closer to the surface layer side.

Example 2

The anodized titanium material according to the present disclosure was prepared in the same manner as the manner in Example 1 except that the electrolysis time of the anodization in the step (b1) was changed to 60 minutes. The obtained anodized titanium layer had a film thickness of 25 μm, a Vickers hardness of 260, a withstand voltage at 25° C. of 500 V or more, and a surface roughness Ra of less than 1.6 μm (Ra=0.644 μm and Rz=4.144 μm). No delamination was observed in the tape peeling test.

Comparative Example 1

Comparative Example 1 is a comparative example in which the anodized titanium material was attempted to be prepared in the same manner as the manner in Example 1 except that the temperature of the first electrolytic solution of the step (b1) was changed to 25° C.

The obtained anodized titanium layer had a film thickness of less than 20 μm, a Vickers hardness of 160, a withstand voltage at 25° C. of 250 V, and a surface roughness Ra of less than 1.6 μm. No delamination was observed in the tape peeling test.

Figure 11:
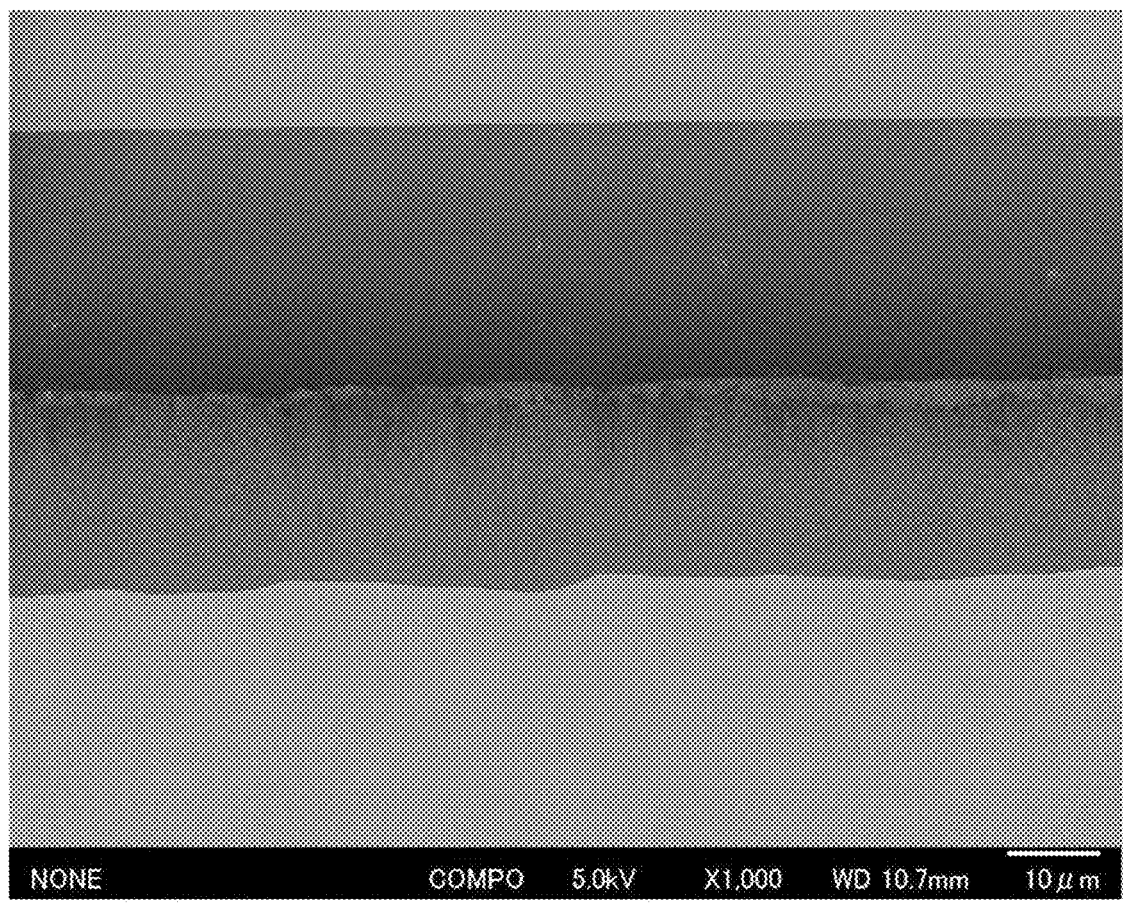
FIG. 11 is the sectional SEM image of an anodized titanium material obtained in Comparative Example 1.

The obtained sectional SEM image (acceleration voltage: 5.0 kV, backscattered electron detection, and magnification: 1,000 times) of the obtained anodized titanium material is illustrated in FIG. 11. From FIG. 11, it can be read that no coarse voids having a pore width of 1 μm or more exist in the in-plane direction in the first anodized titanium layer and that no micro-arc oxidation occurred. On the other hand, it is found that the film thickness of the anodized titanium layer obtained in Comparative Example 1 is clearly thinner than the thickness of the anodized titanium layer obtained in Example 1 as comparing FIG. 11 with FIG. 8(A).

Comparative Example 2

Comparative Example 2 is a comparative example in which the anodized titanium material was attempted to be prepared in the same manner as the manner in Example 1 except that the relative flow rate of the electrolytic solution with respect to the processed material in the step (b1) was changed to 0.8 cm/second.

The obtained coated film was extremely thin and thus the film thickness was not able to be measured by the eddy current type film thickness meter and the Vickers hardness was also not able to be measured. The withstand voltage was 50 V and the surface roughness Ra was less than 1.6 μm. The coated film was delaminated in the tape peeling test.

Comparative Example 3

The anodized titanium material was attempted to be prepared in the same manner as the manner in Example 1 except that the relative flow rate of the electrolytic solution with respect to the processed material in the step (b1) was changed to 5.65 cm/second.

The obtained anodized titanium layer had a film thickness of less than 20 μm, a Vickers hardness of 250, a withstand voltage at 25° C. of 250 V, and a surface roughness Ra of less than 1.6 μm. Partial delamination was observed in the tape peeling test.

Comparative Example 4

The anodized titanium material was attempted to be prepared in the same manner as the manner in Example 1 except that the electrolysis conditions were changed into conditions (electrolytic solution:phosphoric acid-sulfuric acid aqueous solution (sulfuric acid 1.5 mol/L and phosphoric acid 0.3 mol/L), electrolysis voltage: 300 V, electrolysis current density: 10 mA/cm$^2$, and electrolysis time: 30 minutes) in which the micro-arc oxidation (plasma electrolytic oxidation) was able to occur in the step (b1).

The Vickers hardness was not able to be measured because the film thickness of the obtained anodized titanium layer was 5 μm or less, which was thin. The withstand voltage was 250 V and the surface roughness Ra was 1.6 μm or more. No delamination was observed in the tape peeling test.

Figure 12A:
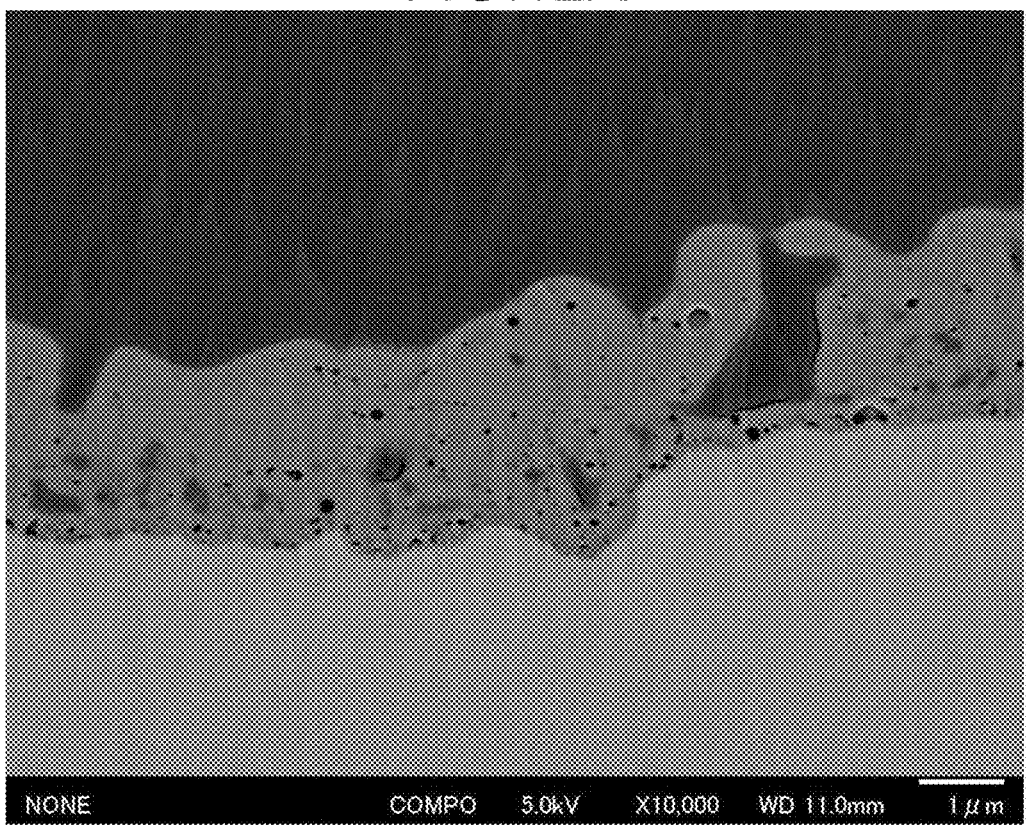
FIG. 12(A) is the sectional SEM image of an anodized titanium material obtained in Comparative Example 4.
Figure 12B:
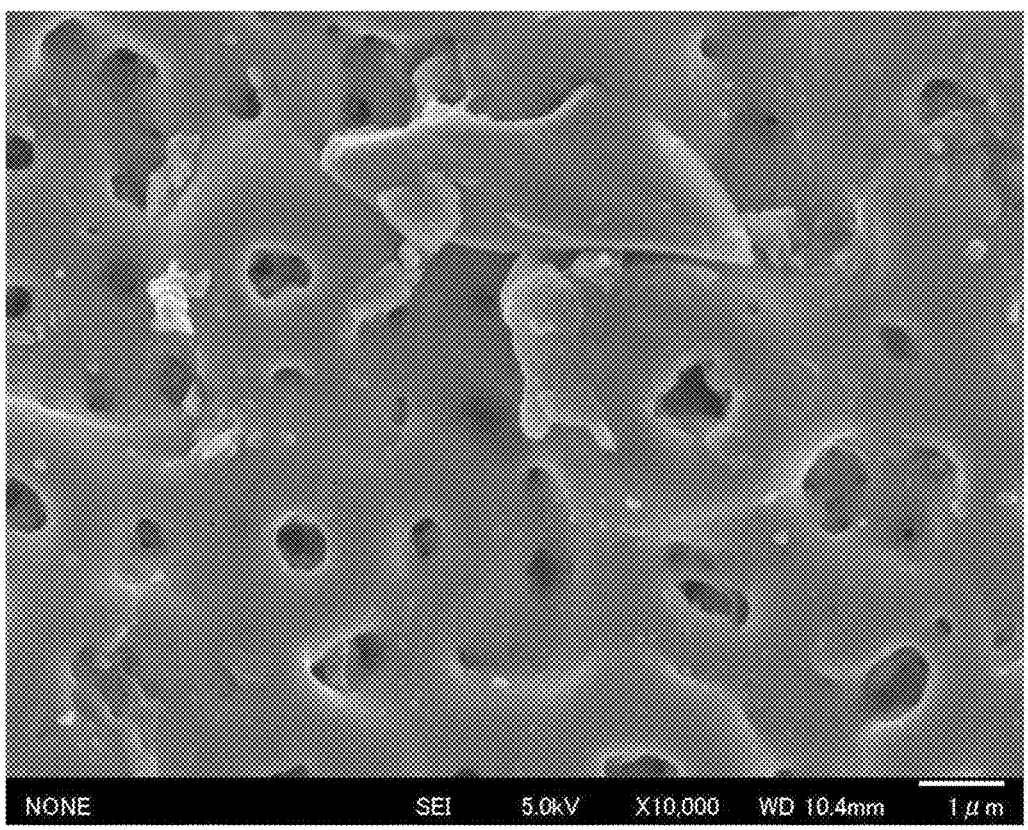
FIG. 12(B) is the surface SEM image of the anodized titanium material obtained in Comparative Example 4.

The sectional SEM image (acceleration voltage: 5.0 kV, backscattered electron detection, and magnification: 10,000 times) and the surface SEM image (acceleration voltage: 5.0 kV, backscattered electron detection, and magnification: 10,000 times) of the obtained anodized titanium material are illustrated in FIGS. 12(A) and 12(B), respectively. From FIG. 12(A), it can be found that the anodized titanium layer obtained in Comparative Example 4 was thinner than the anodized titanium layer obtained in Example 1 (refer to FIG. 8(A)) and at the same time, had coarse voids having a pore width of 1 μm in the in-plane direction and thus that the micro-arc oxidation occurred. The action of micro-arc oxidation to form the voids is generally isotropic in the in-plane direction, and thus the coarse voids observed in the sectional SEM image of FIG. 12(A) are considered to have a depth equivalent to the width direction. The surface roughness is clearly worse than that of Example 1 (refer to FIGS. 8(A) and 9(A)). In the surface SEM image of FIG. 12(B), pore sections (opening parts) having a shape capable of including a circle having a diameter of 0.5 μm or more appears. From this point, it is also understood that coarse voids are formed by the micro-arc oxidation.

Comparative Example 5

Comparative Example 5 is a comparative example in which an anodized aluminum coated film for comparison was prepared. In accordance with JIS H8601, an Al—Mg—Si-based aluminum alloy (A6061) plate was anodized in a sulfuric acid bath to prepare a sulfated alumite coated film (film thickness 50 μm) on the surface of the plate material. The withstand voltage (dielectric breakdown voltage) of the sulfuric acid alumite coated film at 25° C. was 1,602 V.

Comparative Example 6

Comparative Example 5 is a comparative example in which an anodized aluminum coated film for comparison was prepared. In accordance with JIS H8601, an Al—Ma—Si-based aluminum alloy (A6061) plate was anodized in an oxalic acid bath to prepare an oxalic acid alumite coated film (film thickness 24 μm) on the surface of the plate material. The withstand voltage (dielectric breakdown voltage) of the oxalic acid alumite coated film at 25° C. was 1,027 V.

<Temperature Dependence of Withstand Voltage>

Figure 13A:
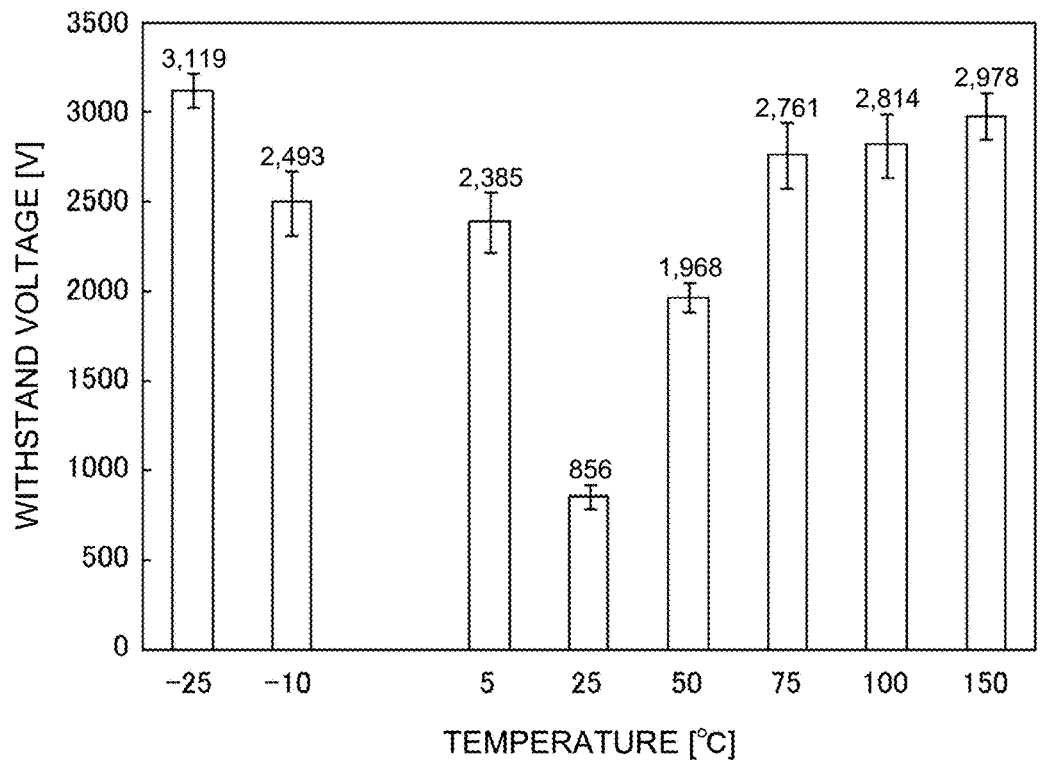
FIGS. 13(A) and 13(B) include graphs illustrating the temperature dependence of the withstand voltage of the anodized titanium layers obtained in Examples 1 and 2.
Figure 13B:
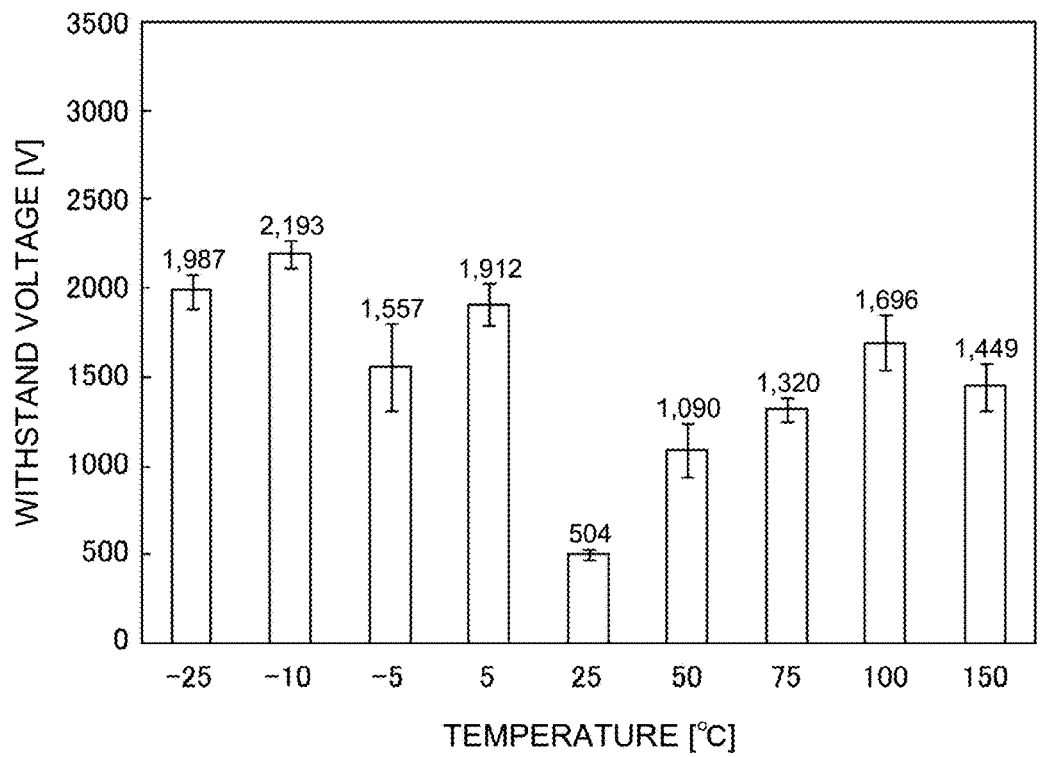

For each of the anodized titanium materials produced in Examples 1 and 2, the temperature dependence of the withstand voltage of the anodized titanium layer was evaluated. The withstand voltage was obtained by measuring the withstand voltage at each temperature three to eight times with an insulator voltage tester (voltage-rising speed 100 V/s) in accordance with JIS H8687 and the average value was calculated. The results are illustrated in FIGS. 13(A) and 13(B). FIG. 13(A) is a graph illustrating the measurement results of the withstand voltage of the anodized titanium layer obtained in Example 1 with respect to each temperature of the anodized titanium material. FIG. 13(B) is a graph illustrating the measurement result of the withstand voltage of the anodized titanium layer obtained in Example 2 with respect to each temperature of the anodized titanium material. In the graphs of FIGS. 13(A) and 13(B), error bars represent standard errors of the measured values. From FIGS. 13(A) and 13(B), it is understood that (1) the withstand voltage increases as the film thickness of the anodized titanium layer increases, and that (2) the withstand voltage is lowest in the vicinity of normal temperature (25° C.) and the withstand voltage increases when the temperature increases or decreases. It is noted that the measurement of the withstand voltage at each temperature was performed a plurality of times for the same sample but the change in the withstand voltage due to the temperature change was generally reversible.

Figure 14:
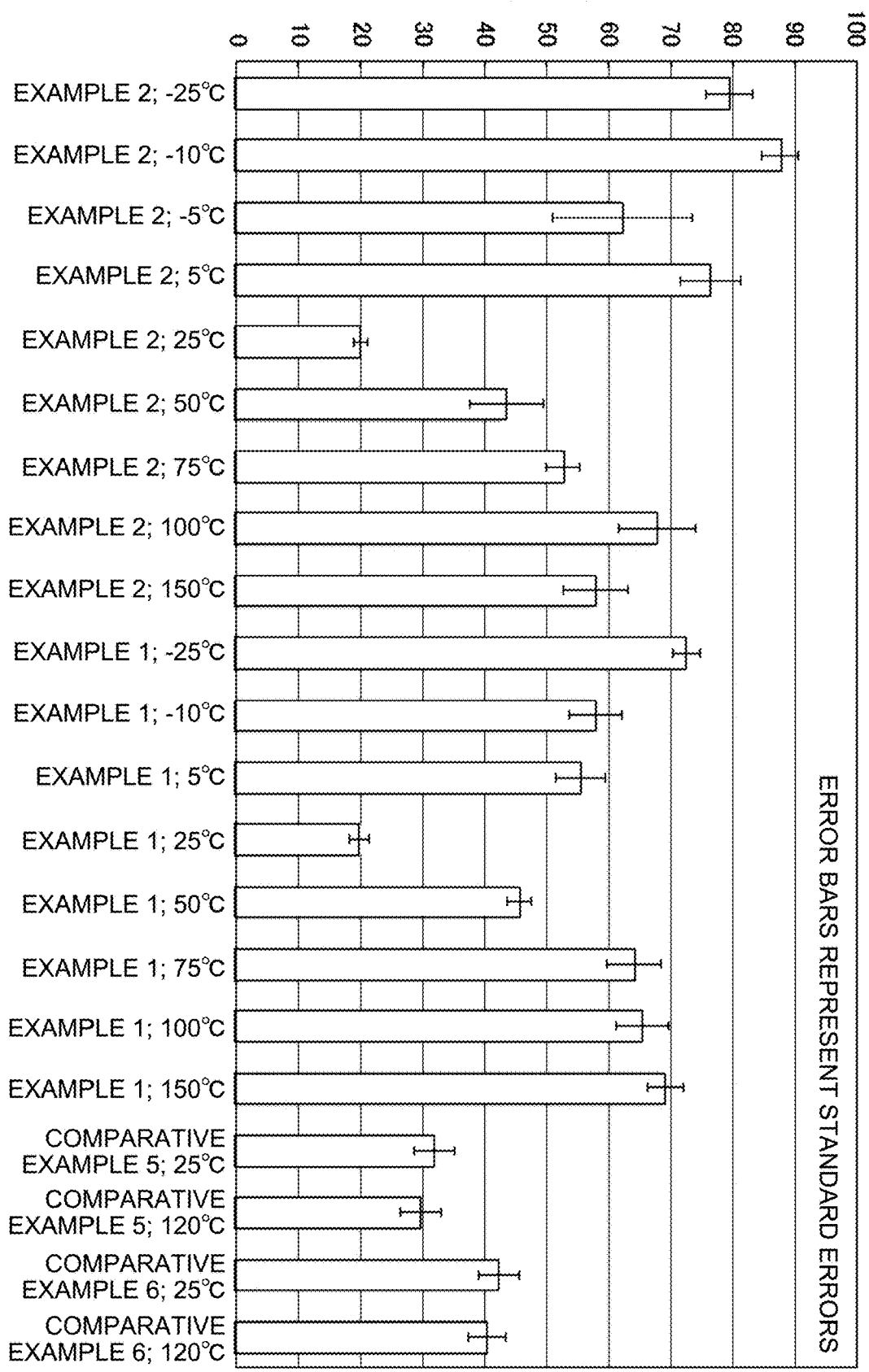
FIG. 14 is a graph illustrating the temperature dependence of the withstand voltages per unit film thickness of the anodized titanium layers obtained in Examples 1 and 2 and the alumite coated films obtained in Comparative Examples 5 and 6.

With respect to the alumite coated films prepared in Comparative Examples 5 and 6, the temperature dependence of the withstand voltage was also evaluated. FIG. 14 illustrates the results thereof together with the results of Examples 1 and 2. The vertical axis of the graph in FIG. 14 represents the withstand voltage (V/μm) per unit film thickness. As understood from FIG. 14, the withstand voltages of the alumite coated films prepared in Comparative Examples 5 and 6 decreased when the temperature was raised from 25° C. to 120° C. The decrease in the withstand voltage due to exposing the alumite coated film to a high temperature is generally irreversible.

The anodized coated film (alumite coated film) such as anodized oxalic acid alumite or sulfuric acid alumite formed on an aluminum base material generates cracks and decreases the withstand voltage at a high temperature such as 150° C. due to the difference in the thermal expansion coefficients between the aluminum base material and the anodized coated film (alumite coated film). Therefore, this decrease in the withstand voltage is irreversible and thus the withstand voltage decreased by exposing the alumite coated film to a high temperature does not recover even when the temperature of the alumite coated film is returned to normal temperature. In FIG. 14, the withstand voltages of the alumite coated films of Comparative Examples 5 and 6 have also already been reduced at 120° C. Therefore, the conventional anodized aluminum coated film cannot be used in a location repeatedly exposed to a heat history such as a high temperature of, for example, 150° C. or a low temperature of, for example, −50° C.

On the other hand, the anodized titanium layer provided on the anodized titanium material according to the present disclosure has the unique characteristics that (1) the withstand voltage is lowest in the vicinity of normal temperature (25° C.) and rises when the temperature is raised from normal temperature or the temperature is lowered from normal temperature and that (2) the change in the withstand voltage due to temperature change is reversible.

Therefore, the anodized titanium material according to the present disclosure can be particularly preferably used for members that require an electrical insulation property and are repeatedly exposed to heat history.

Example 3

Example 3 is an example in which the anodized titanium material 200 (FIG. 5) was prepared by using the same cold-rolled titanium plate (100 mm×50 mm×thickness 1 mm; surface roughness Ra (μm)=0.439 and Rz (μm)=3.647) as the plate used in Example 1 as the processed material, and subjecting a half area thereof having a size of 50 mm×50 mm to the anodizing process by the production method S200 (FIG. 2) of the anodized titanium material.

Similar to Example 1, the processed material was subjected to alkaline electrolytic degreasing and etching as the preprocess.

After the preprocess, the processed material was anodized in the first electrolytic solution (Step (b1)). The first trolytic solution was prepared by dissolving acidic ammonium fluoride in a mixed solvent of ethylene glycol and pure water (mixing volume ratio 95:5) so as to be a concentration of 6 g/L. Into a 5 L beaker (inner diameter 190 mm), 5 L of this first electrolytic solution was poured to prepare an electrolysis bath, and the temperature of the electrolytic solution was maintained at 5° C. with a cooling device. The processed material serving as an anode was immersed in the electrolysis bath and the electrolysis was performed for 130 minutes under the conditions of an electrolysis voltage of 130 V and an electrolysis current density of 10 mA/cm$^2$ while the electrolytic solution was being stirred at a constant speed with a magnetic stirrer. During the electrolysis, the relative flow rate of the electrolytic solution with respect to the processed material was maintained at 4 cm/sec.

After completion of the electrolysis in the step (b1), the processed material was further anodized in the second electrolytic solution (Step (b2)). As the second electrolytic solution, a mixed solution of ethylene glycol, pure water, and a 30% hydrogen peroxide solution (mixing volume ratio: 90:50:5) was used. Into a 5 L beaker (inner diameter 190 mm), 5 L of the second electrolytic solution was poured to prepare an electrolysis bath, and the temperature of the electrolytic solution was maintained at 10° C. by the cooling device. The processed material after completion of the step (b1) was immersed in the electrolysis bath without washing, and served as an anode. The electrolysis was performed for 30 minutes under the conditions of an electrolysis voltage of 100 V and an electrolysis current density of 10 mA/cm$^2$ while the electrolytic solution was being stirred at a constant speed with a magnetic stirrer. During the electrolysis, the relative flow rate of the electrolytic solution with respect to the processed material was maintained at 4 cm/sec.

After completion of the electrolysis in step (b2), the processed material was pulled out of the electrolysis bath, washed with ethanol and pure water, and dried by air to give the anodized titanium material 200.

The obtained anodized titanium layer had a film thickness of 50 μm or more, a Vickers hardness of 250 or more, a withstand voltage of 1,000 V or more, and a surface roughness Ra of less than 1.6 μm (Ra=1.072 μm and Rz=5.882 μm). No delamination was observed in the tape peeling test or the ultrasonic impact test and a coated film having extremely high adhesion was obtained.

Figure 15A:
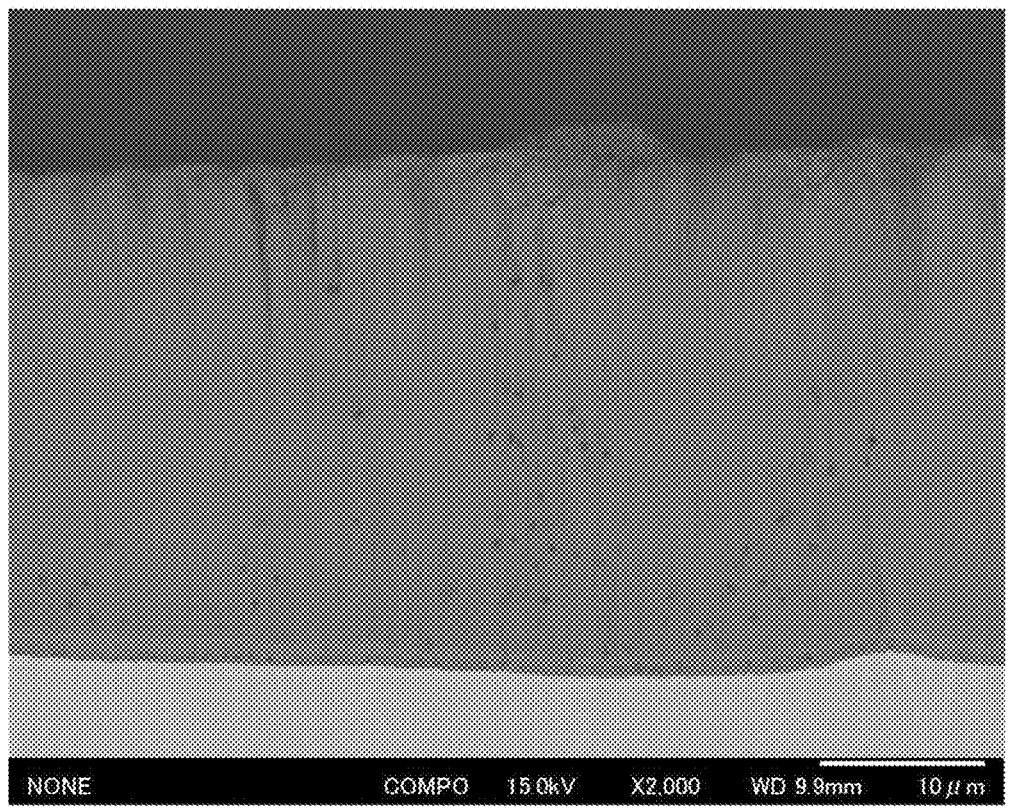
FIGS. 15(A) and 15(B) include the sectional SEM images of an anodized titanium material obtained in Example 3.
Figure 15B:
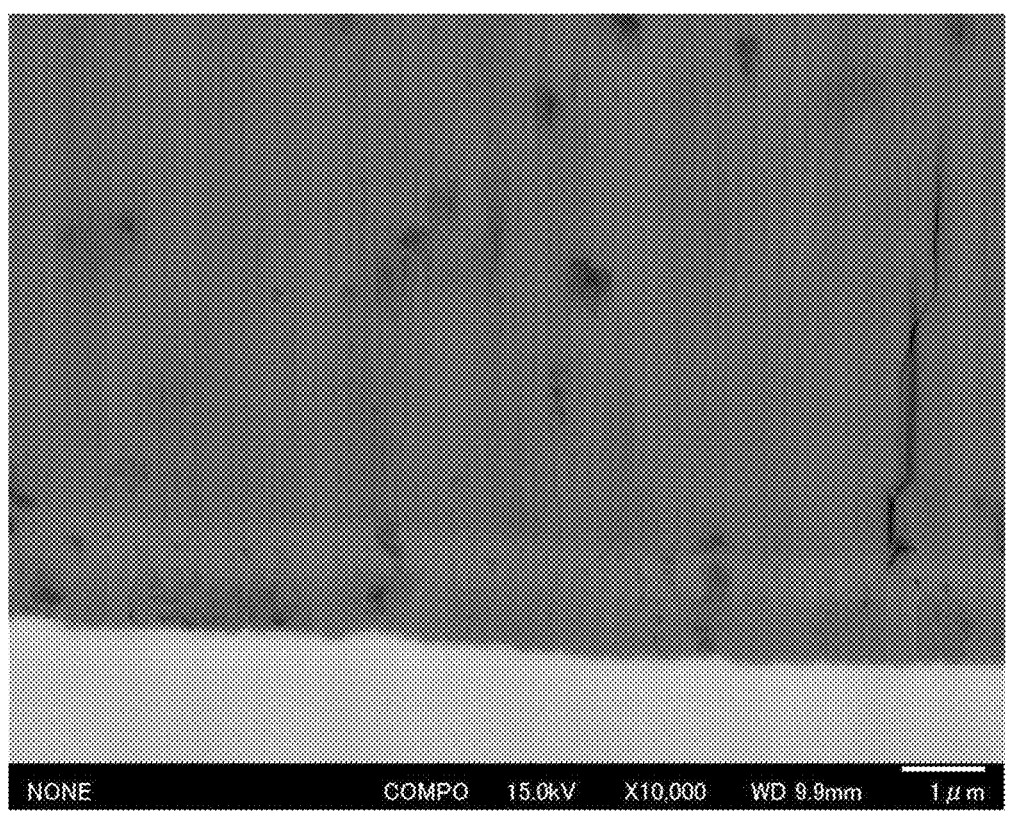
Figure 16:
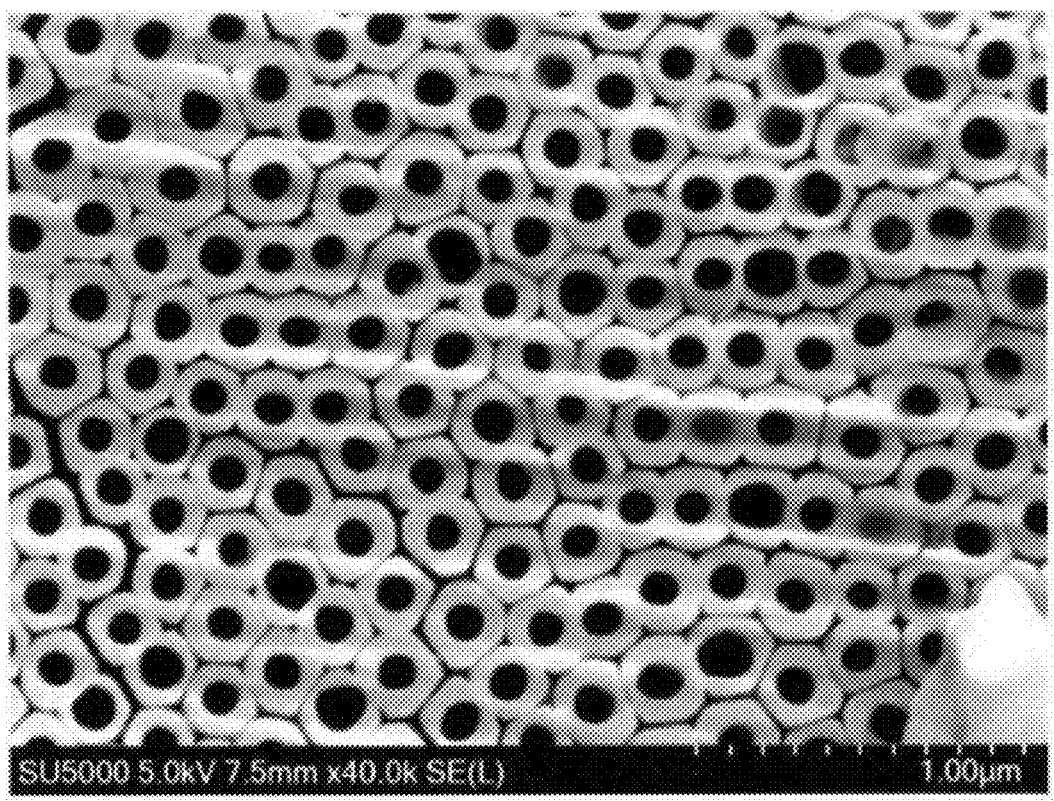
FIG. 16 is the surface SEM image of the anodized titanium material obtained in Example 3.

The sectional SEM images and the surface SEM image of the obtained anodized titanium material are illustrated in FIGS. 15(A) and 15(B) and FIG. 16, respectively. FIG. 15(A) is the sectional SEM image (acceleration voltage: 15.0 kV, backscattered electron detection, and magnification: 2,000 times) of the entire anodized titanium layer and FIG. 15(B) is the sectional SEM image (acceleration voltage: 15.0 kV, backscattered electron detection, and magnification: 10,000 times) in the vicinity of the interface between the anodized titanium layer and the titanium base material. From FIGS. 15 (A) and (B), it can be read that no coarse voids in the first anodized titanium layer exist and that the second anodized titanium layer having a thickness of about 2 μm grown at the step (b2) exists between the first anodized titanium layer grown at the step (b1) and the titanium base material. From FIG. 15(B), it can be read that the second anodized titanium layer has a porous structure affected by the first anodized titanium layer. FIG. 16 is the surface SEM image (acceleration voltage: 5.0 kV, backscattered electron detection, and magnification: 40,000 times) of the anodized titanium layer. In FIG. 16, the ends of tubular pores extending in the thickness direction of the anodized titanium layer appear. From FIG. 16, it can be read that the diameter of each of the tubular pores is 0.3 μm or less and that no pore sections (opening parts) having a shape capable of including a circle having a diameter of 0.5 μm or more are observed.

Figure 17:
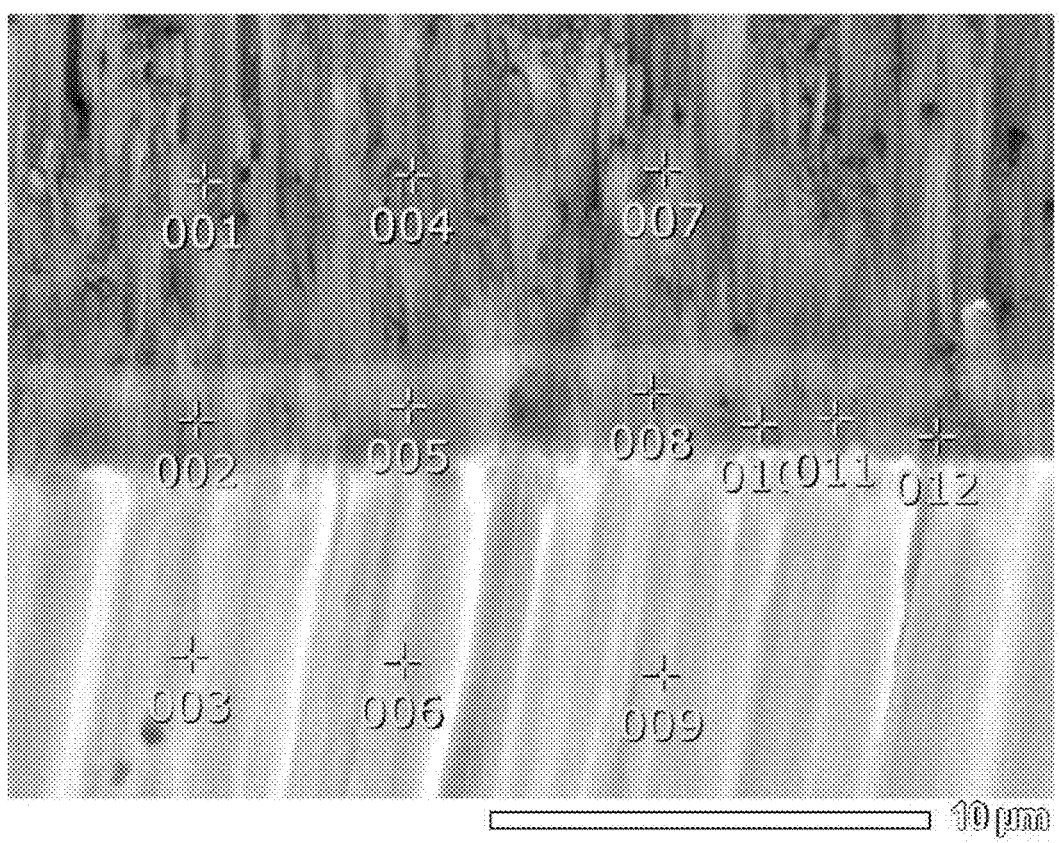
FIG. 17 is a view illustrating the sectional SEM image of the anodized titanium material obtained in Example 3 and electron beam irradiation locations in EDS measurement.

The film composition of the anodized titanium material obtained in Example 3 was further evaluated by EDS measurement using an energy dispersive X-ray spectrometer (JEOL Ltd., JED2000). The acceleration voltage was determined to be 15.0 kV. In FIG. 17, the locations where the composition was measured (the locations irradiated with the electron beams in the EDS measurement) in the sectional SEM image are represented by numerals 1 to 12. Measurement locations 1, 4, and 7 are in the first anodized titanium layers, measurement locations 2, 5, 8, and 10 to 12 are in the second anodized titanium layers, and measurement locations 3, 6, and 9 are in the titanium base material. Measurement locations 1, 4, and 7 are about 4 μm apart from the interface between the first anodized titanium layer and the second anodized titanium layer. The measurement results of the composition at each of the measurement locations are listed in Table 1.

TABLE 1

| Measured location | Composition (atomic %) | | | Location of electron beam irradiation |
|---|---|---|---|---|
| | O | F | Ti | |
| 1 | 63.0 | 7.9 | 29.0 | First anodized titanium layer |
| 2 | 70.8 | 2.4 | 26.8 | Second anodized titanium layer |
| 3 | 0.0 | 0.0 | 100.0 | Titanium base material |
| 4 | 67.8 | 8.2 | 24.0 | First anodized titanium layer |
| 5 | 70.8 | 2.1 | 27.2 | Second anodized titanium layer |
| 6 | 0.0 | 0.0 | 100.0 | Titanium base material |
| 7 | 65.7 | 8.1 | 26.1 | First anodized titanium layer |
| 8 | 69.0 | 1.5 | 29.4 | Second anodized titanium layer |
| 9 | 0.0 | 0.0 | 100.0 | Titanium base material |
| 10 | 69.4 | 0.0 | 30.6 | Second anodized titanium layer |
| 11 | 68.3 | 0.0 | 31.7 | Second anodized titanium layer |
| 12 | 66.6 | 0.0 | 33.4 | Second anodized titanium layer |

From the SEM observation of the section, it is found that the film thickness of the second anodized titanium layer is about 2 μm. In the EDS measurement, the fluorine content measured by irradiating the first anodized titanium layer with electron beams (acceleration voltage: 15.0 kV) was about 8 atomic % (measuring locations: 1, 4, and 7), whereas the fluorine content measured by irradiating the part of the second anodized titanium layer at the first anodized titanium layer side from the intermediate line between the first anodized titanium layer and the titanium base material with the electron beams was about 2 atomic % (measurement locations: 2, 5, and 8). In addition, the fluorine content measured by irradiating the part of the second anodized titanium layer at the titanium base material side from the intermediate line with the electron beams was less than the detection limit (0.1 atomic %) (measurement locations: 10 to 12). From these measurements, it is found that the titanium content (atomic %) of the second anodized titanium layer is lower than the titanium content (atomic %) of the first anodized titanium layer. The actual fluorine content in the second anodized titanium layer is less than the detection limit (0.1 atomic %) of the EDS measurement and thus the second anodized titanium layer is considered to be a layer including substantially no fluorine.

<Expansion and Shrinkage Characteristics of Anodized Titanium Layer Due to Temperature Change>

With respect to the section of the anodized titanium layer obtained in Example 3, SEM observation (acceleration voltage: 5.0 kV, backscattered electron detection, and magnification: 2,200 times) was performed while the temperature was being changed. First, SEM observation was performed at room temperature (26° C.), thereafter the sample temperature was raised to 150° C. to perform SEM observation, and thereafter the sample was opened to the atmosphere to return the sample temperature to room temperature (26° C.) to perform SEM observation again. The sample temperature during the SEM observation was controlled using a heating stage (Gatan Inc., Murano heating stage). Furthermore, only the anodized titanium layer was separated from the anodized titanium material in Example 3 by an ion milling apparatus (JEOL Ltd., IB-09020CP). The surface of the surface layer side and the surface of the base material side of the separated anodized titanium layer were subjected to SEM observation (acceleration voltage: 5.0 kV, backscattered electron detection, and magnification: 40,000 times) while the temperature was being changed in the same manner as described above.

The results are illustrated in FIGS. 18(A) to 18(I). In FIGS. 18(A) to 18(I), the left columns (A), (D), and (G) are the SEM images at the initial room temperature (26° C.), the center columns (B), (E), and (H) are the SEM images at 150° C., and right columns (C), (F), and (I) are the SEM images when the sample temperature was returned to room temperature (26° C.). The upper row (A), (B), and (C) are the SEM images of the surface of the surface layer side of the anodized titanium layer, the middle row (D), (E), and (F) are the SEM images of the surface of the base material side of the anodized titanium layer, and the lower row (G), (H), and (I) are the SEM images of the section of the anodized titanium layer. The temperature raised from normal temperature to 150° C. generally caused the anodized titanium layer to shrink by about 3% in the dimension of length in the planar direction of the surface layer side ((A)→(B)), to shrink by about 2% in the dimension of length in the in-plane direction of the base material side ((D)→(E)), to shrink by about 2.5% in the dimension of length in the in-plane direction of an approximately intermediate part between the surface layer side and the base material side ((G)→(H)), and to shrink by about 1% in the dimension of length in the thickness direction ((G)→(H)). The temperature lowering from 150° C. to normal temperature generally caused the anodized titanium layer to shrink by about 8% in the dimension of length in the planar direction of the surface layer side ((B)→(C)), to expand by about 2% in the dimension of length in the in-plane direction of the base material side ((E)→(F)), to expand by about 1% in the dimension of length in the in-plane direction of an approximately intermediate part between the surface layer side and the base material side ((H)→(I)), and to expand by about 0.5% in the dimension of length in the thickness direction ((H)→(I)). Although not intended to be limited by theory, as described above, it is considered that the shrinkage of the pore structure of the anodized titanium layer associated with temperature rising results in the increase in the withstand voltage associated with increasing temperature. It is also considered that the generally reversible expansion and shrinkage of the pore structure except for the surface layer part causes the generally reversible change in the withstand voltage due to the change in temperature.

The anodized titanium material according to the first aspect of the present disclosure can be suitably used for applications in which a high voltage is applied between the titanium base material and the anodized titanium layer (for example, applications exposed to a plasma atmosphere and an electrostatic chuck) because the anodized titanium layer has the improved withstand voltage property. The anodized titanium material according to the first aspect of the present disclosure can also be preferably used as a vacuum apparatus member requiring a vacuum sealing property because the anodized titanium material according to the first aspect of the present disclosure has sufficient hardness and surface smoothness.

According to the electrostatic chuck for a plasma etching apparatus according to the second aspect of the present disclosure, dielectric breakdown can be prevented even under the conditions of the plasma etching process because the electrostatic chuck has the anodized titanium layer of the anodized titanium material according to the first aspect of the present disclosure at the outermost surface layer. In addition, generation of cracks can be prevented even under the conditions of the plasma etching process because the difference in the thermal expansion coefficients between titanium and anodized titanium is small and thus the electrostatic chuck has high heat resistance.

According to the cooling plate for a plasma etching apparatus according to the third aspect of the present disclosure, dielectric breakdown can be prevented even when a high-frequency voltage is applied to the cooling plate in the plasma etching apparatus because the cooling plate has the anodized titanium layer of the anodized titanium material according to the first aspect of the present disclosure at the outermost surface layer. In addition, generation of cracks can be prevented even under the conditions of the plasma etching process because the difference in the thermal expansion coefficients between titanium and anodized titanium is small and thus the cooling plate has high heat resistance.

In the shower head for a plasma etching apparatus, to provide a robust protective film such as a thermally sprayed ceramic film on the inner peripheral surface of the gas discharge hole is difficult. The shower head for a plasma etching apparatus according to the fourth aspect of the present disclosure includes the wall member including the anodized titanium material according to the first aspect of the present disclosure, in which the anodized titanium layer is exposed at least at a plurality of inner peripheral surfaces of gas discharge holes. In other words, in the shower head for the plasma etching apparatus according to the present disclosure, the anodized titanium layer acts as a protective film at least at the inner peripheral surface of the gas discharge hole. As described above, the anodized titanium material according to the present disclosure has high heat resistance due to a small difference in the thermal expansion coefficients between the titanium base material and the anodized titanium layer, and thus the generation of cracks in the anodized titanium layer is prevented even under the conditions of the plasma etching process. Therefore, according to the shower head for the plasma etching apparatus of the present disclosure, the inner peripheral surface of the gas discharge hole can be appropriately protected even under the conditions of the plasma etching process.

According to the method for producing the anodized titanium material according to the fifth aspect of the present disclosure, the anodized titanium material having the improved withstand voltage property can be produced.

The embodiment disclosed herein should be rendered exemplary and not as anything restrictive. Actually, the embodiment described above can be implemented in various forms. Furthermore, various forms of omissions, replacements, and modifications of the embodiment described above are still possible, within the scope not deviating from the scope of the appended claims and the essence thereof.

What is claimed is:

1. An anodized titanium material comprising:
   a titanium base material; and
   an anodized titanium layer provided on a surface of the titanium base material, wherein
   the anodized titanium layer comprises
   a porous first anodized titanium layer;
   the anodized titanium layer has a withstand voltage at 25° C. of 500 V or more, a Vickers hardness of 200 or more, a film thickness of 20 μm or more and less than 80 μm, an arithmetic average roughness Ra of a surface of less than 1.6 μm, and a maximum height roughness Rz of the surface is less than 6.3 μm;
   in a section perpendicular to a thickness direction of the first anodized titanium layer and in the surface of the first anodized titanium layer, no pore sections having a shape capable of including a circle having a diameter of 0.5 μm or more are observed; and the first anodized titanium layer comprises a plurality of tubular pores extending in a direction intersecting the surface of the anodized titanium layer, wherein the anodized titanium layer further comprises
a second anodized titanium layer provided between the titanium base material and the first anodized titanium layer; and
a fluorine content (unit: atomic %) in the second anodized titanium layer is lower than a fluorine content (unit: atomic %) in the first anodized titanium layer.

2. The anodized titanium material according to claim 1, wherein the anodized titanium layer has a withstand voltage at 150° C. higher than a withstand voltage at 25° C.

3. The anodized titanium material according to claim 1, further comprising a metal base material made of a metal other than titanium, wherein
the titanium base material is provided on a surface of the metal base material.

4. The anodized titanium material according to claim 1, wherein the anodized titanium material is used as a vacuum apparatus member and the anodized titanium layer is exposed to a plasma atmosphere.

5. An electrostatic chuck used in a plasma etching apparatus, the electrostatic chuck comprising:
the anodized titanium material according to claim 1, wherein
the anodized titanium layer is provided on an outermost surface of the electrostatic chuck and exposed to a plasma atmosphere.

6. A cooling plate used in a plasma etching apparatus, the cooling plate comprising:
the anodized titanium material according to claim 1; and
a refrigerant channel provided in an internal part of the cooling plate and allowing a refrigerant to flow, wherein
the anodized titanium layer is provided on an outermost surface of the cooling plate.

7. A shower head used in a plasma etching apparatus, the shower head comprising:
a wall member comprising the anodized titanium material according to claim 1 and defining an internal space, wherein
the wall member comprises at least a bottom surface;
the wall member comprises
a gas introduction port for flowing a processing gas for plasma etching into the internal space, and
a plurality of gas discharge holes provided on the bottom surface and allowing the processing gas to flow out of the internal space; and
the anodized titanium layer is exposed at least at inner peripheral surfaces of the gas discharge holes.

* * * * *